(12) United States Patent
Jang et al.

(10) Patent No.: US 12,482,721 B2
(45) Date of Patent: Nov. 25, 2025

(54) SEMICONDUCTOR PACKAGE INCLUDING HEAT DISSIPATION STRUCTURE

(71) Applicant: SAMSUNG ELECTRONICS CO., LTD., Suwon-si (KR)

(72) Inventors: Yeonho Jang, Suwon-si (KR); Inhyung Song, Suwon-si (KR); Kyungdon Mun, Suwon-si (KR); Hyeonjeong Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 386 days.

(21) Appl. No.: 18/197,998

(22) Filed: May 16, 2023

(65) Prior Publication Data
US 2024/0136250 A1 Apr. 25, 2024

(30) Foreign Application Priority Data

Oct. 6, 2022 (KR) .................. 10-2022-0128083

(51) Int. Cl.
*H01L 23/373* (2006.01)
*H01L 23/00* (2006.01)
(Continued)

(52) U.S. Cl.
CPC ...... *H01L 23/3738* (2013.01); *H01L 23/3128* (2013.01); *H01L 23/49816* (2013.01); *H01L 24/08* (2013.01); *H01L 24/16* (2013.01); *H01L 24/32* (2013.01); *H01L 24/73* (2013.01); *H01L 25/0652* (2013.01); *H01L 25/165* (2013.01); *H01L 25/0657* (2013.01);
(Continued)

(58) Field of Classification Search
CPC . H01L 2225/06513; H01L 2225/06524; H01L 2225/06541; H01L 2924/1431; H01L 2924/1436; H01L 21/6835; H01L 2221/68345; H01L 23/4334; H01L 23/49811; H01L 25/03; H01L 2225/06586; H01L 25/18; H01L 25/50; H01L 2225/06589; H01L 23/3157; H01L 23/367

See application file for complete search history.

(56) References Cited

U.S. PATENT DOCUMENTS 8,884,431 B2 11/2014 Lin et al.
10,312,221 B1 6/2019 Agarwal et al.
(Continued)

OTHER PUBLICATIONS

Yu, Douglas C. H. et al., "Foundry Perspectives on 2.5D/3D Integration and Roadmap", 2021 IEEE International Electron Devices Meeting (IEDM), Date of Conference: Dec. 11-16, 2021, Date added to IEEE Xplorer: Mar. 9, 2022. (5 pages total).

*Primary Examiner* — Thanh Y. Tran
(74) *Attorney, Agent, or Firm* — Sughrue Mion, PLLC

(57) ABSTRACT

The present disclosure provides semiconductor packages including a heat dissipation structure. In some embodiments, the semiconductor package includes a package substrate, a stacked chip disposed on the package substrate and including a lower chip and an upper chip, a memory chip disposed on the package substrate adjacent to the stacked chip, and an encapsulant encapsulating at least a portion of the stacked chip and the memory chip on the package substrate. An upper surface of the upper chip is exposed from the encapsulant. A dummy silicon chip is in contact with the upper chip on the lower chip.

20 Claims, 24 Drawing Sheets

(51) Int. Cl.
  *H01L 23/31*    (2006.01)
  *H01L 23/498*   (2006.01)
  *H01L 25/065*   (2023.01)
  *H01L 25/16*    (2023.01)

(52) U.S. Cl.
  CPC ............ *H01L 2224/08145* (2013.01); *H01L 2224/16148* (2013.01); *H01L 2224/16225* (2013.01); *H01L 2224/32145* (2013.01); *H01L 2224/73204* (2013.01); *H01L 2224/73253* (2013.01); *H01L 2225/06513* (2013.01); *H01L 2225/06524* (2013.01); *H01L 2225/06541* (2013.01); *H01L 2924/1431* (2013.01); *H01L 2924/1436* (2013.01)

(56) References Cited

U.S. PATENT DOCUMENTS

| | | |
|---|---|---|
| 10,483,187 B2 | 11/2019 | Yu et al. |
| 10,770,430 B1* | 9/2020 | Kim ................ H01L 25/50 |
| 11,145,639 B2 | 10/2021 | Cheng et al. |
| 11,222,867 B1 | 1/2022 | Huang et al. |
| 2020/0365525 A1* | 11/2020 | Wu ................ H01L 21/486 |
| 2021/0225782 A1 | 7/2021 | Cho |
| 2021/0257277 A1 | 8/2021 | Bertrand et al. |
| 2021/0327778 A1* | 10/2021 | Yu ................ H01L 21/561 |
| 2022/0157777 A1* | 5/2022 | Yang ................ H01L 23/562 |
| 2023/0116326 A1* | 4/2023 | Yang ................ H01L 25/18 |
| | | 257/774 |

* cited by examiner

SEMICONDUCTOR PACKAGE INCLUDING HEAT DISSIPATION STRUCTURE

CROSS-REFERENCE TO RELATED APPLICATIONS

This application claims benefit of priority under 35 U.S.C. § 119 to Korean Patent Application No. 10-2022-0128083, filed on Oct. 6, 2022 in the Korean Intellectual Property Office, the disclosure of which is incorporated by reference herein in its entirety.

BACKGROUND

1. Field

The present disclosure relates generally to a semiconductor package, and more particularly, to a semiconductor package including a heat dissipation structure.

2. Description of Related Art

Electronic devices have become more compact and lighter due to the rapid development of the electronics industry and demands of users. As electronic devices become smaller and lighter, semiconductor packages used in them also become smaller and lighter, and in addition, semiconductor packages require high reliability together with high performance and large capacity. As the semiconductor packages have high performance and high capacity, power consumption of the semiconductor packages increases. In addition, heat generation due to an operation of high performance applications of the semiconductor packages has been a major issue.

SUMMARY

The present disclosure provides a semiconductor package having maximized heat dissipation efficiency.

In addition, the issues to be solved by the technical idea of the present disclosure are not limited to those mentioned above, and other issues may be clearly understood by those of ordinary skill in the art from the following descriptions.

According to an aspect of the present disclosure, a semiconductor package is provided. The semiconductor package includes a package substrate, a stacked chip disposed on the package substrate and including a lower chip and an upper chip, a memory chip disposed on the package substrate adjacent to the stacked chip, and an encapsulant encapsulating at least a portion of the stacked chip and the memory chip on the package substrate. An upper surface of the upper chip is exposed from the encapsulant. A dummy silicon chip is in contact with the upper chip on the lower chip.

According to an aspect of the present disclosure, a semiconductor package is provided. The semiconductor package includes a redistribution substrate, a stacked chip disposed on the redistribution substrate and including a lower chip and an upper chip, a memory chip disposed on the redistribution substrate adjacent to the stacked chip, a dummy silicon chip adjacent to the upper chip disposed on the lower chip, and an encapsulant encapsulating the stacked chip, the memory chip, and the dummy silicon chip on the redistribution substrate. An upper surface of the upper chip and an upper surface of the dummy silicon chip are exposed from the encapsulant.

According to an aspect of the present disclosure, a semiconductor package is provided. The semiconductor package includes a redistribution substrate, a stacked chip disposed on the redistribution substrate and including a lower chip and an upper chip, a dynamic random access memory (DRAM) chip disposed on the redistribution substrate adjacent to the stacked chip, a dummy silicon chip adjacent to the upper chip disposed on the lower chip, an encapsulant encapsulating the stacked chip, the DRAM chip, and the dummy silicon chip on the redistribution substrate, and an external connection terminal disposed under a lower surface of the redistribution substrate. An upper surface of the upper chip and an upper surface of the dummy silicon chip are exposed from the encapsulant. At least a portion of side surfaces of the dummy silicon chip are exposed from the encapsulant.

Additional aspects will be set forth in part in the description which follows and, in part, will be apparent from the description, or may be learned by practice of the presented embodiments.

BRIEF DESCRIPTION OF DRAWINGS

The above and other aspects, features, and advantages of certain embodiments of the present disclosure will be more apparent from the following description taken in conjunction with the accompanying drawings in which.

DETAILED DESCRIPTION

Figure 1A:
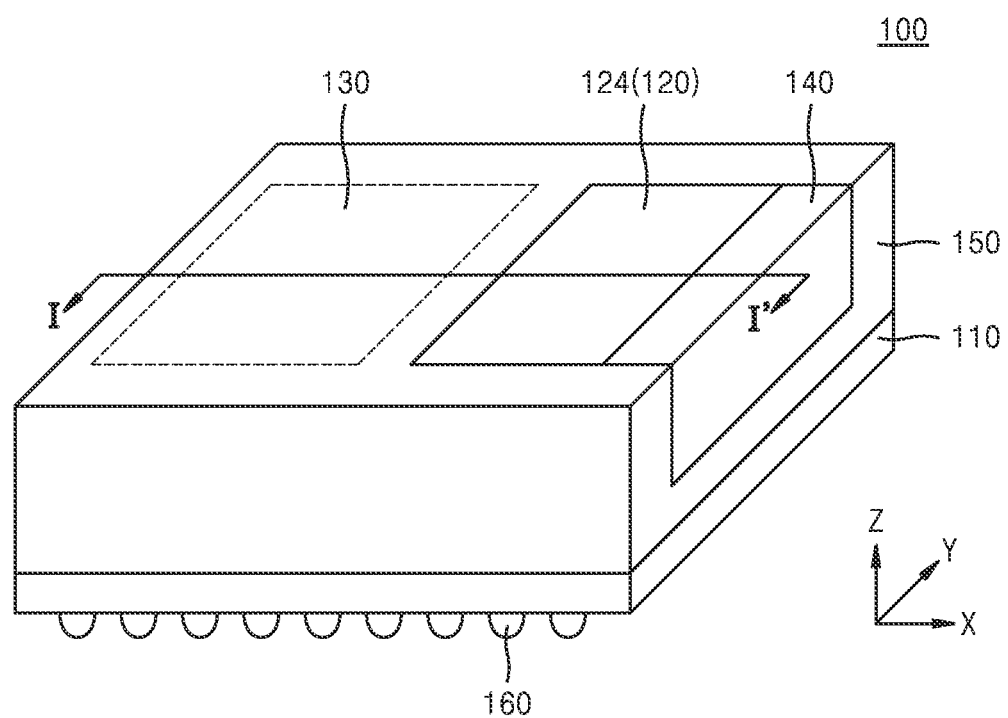
FIGS. 1A and 1B are a perspective view and a cross-sectional view, respectively, schematically illustrating a structure of a semiconductor package, according to an embodiment.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art will recognize that various changes and modifications of the embodiments described herein can be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", etc. may be replaced with terms, such as "first," "second," third" to be used to describe relative positions of elements. The terms "first," "second," third" may be used to described various elements but the elements are not limited by the terms and a "first element" may be referred to as a "second element". Alternatively or additionally, the terms "first", "second", "third", etc. may be used to distinguish components from each other and do not limit the present disclosure. For example, the terms "first", "second", "third", etc. may not necessarily involve an order or a numerical meaning of any form.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

As used herein, terms like "$SiO_2$" may refer to a material made of elements included in each of the terms and is not a chemical formula representing a stoichiometric relationship.

Hereinafter, various embodiments of the present disclosure are described with reference to the accompanying drawings.

Figure 1B:
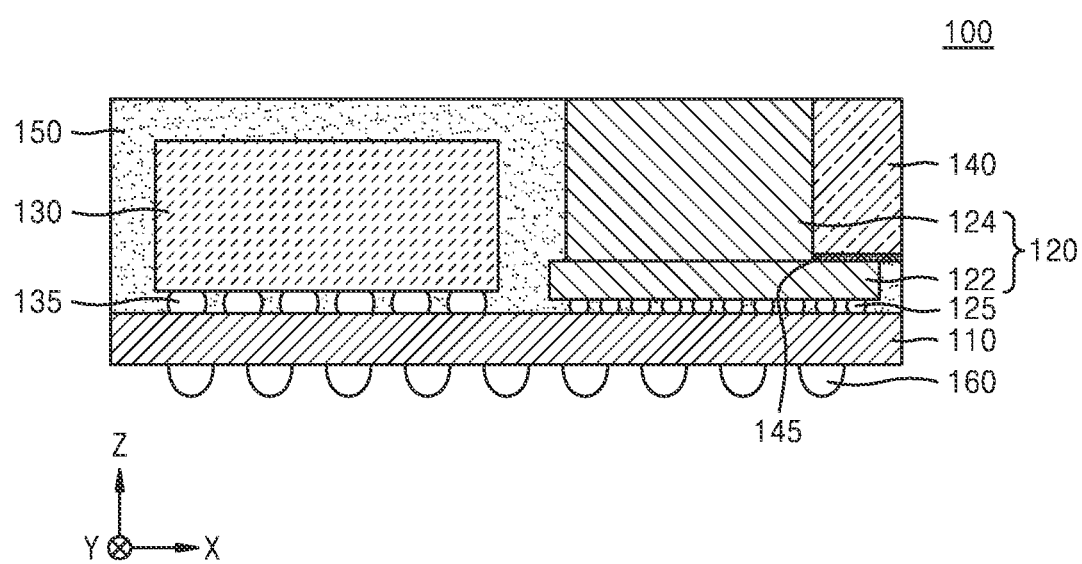
Figure 1C:
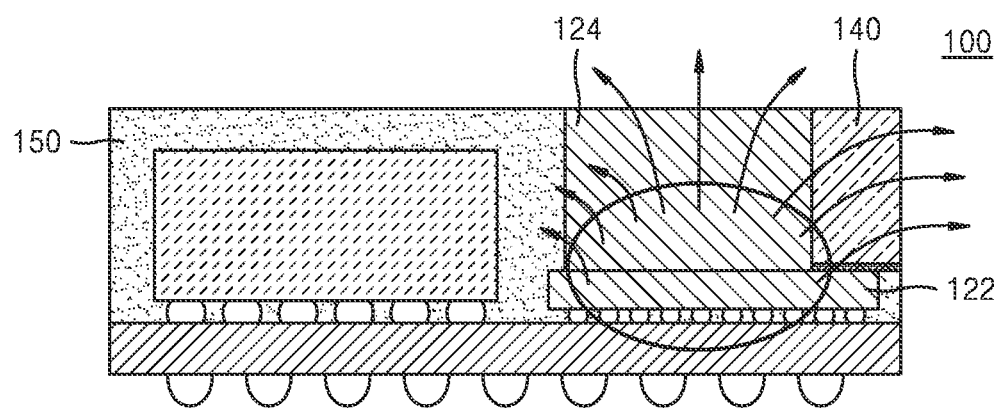
FIG. 1C is a conceptual diagram of a heat dissipation path of the semiconductor package of FIG. 1B, according to an embodiment.

FIG. 1A is a schematic perspective view of a structure of a semiconductor package 100, according to an embodiment. FIG. 1B is a cross-sectional view of the semiconductor package 100 of FIG. 1A taken along line I-I'. FIG. 1C is a conceptual diagram of a heat dissipation path of the semiconductor package 100 of FIG. 1B.

Referring to FIGS. 1A through 1C, the semiconductor package 100 may include a package substrate 110, a stacked chip 120, a memory chip 130, a dummy silicon chip 140, an encapsulant 150, and an external connection terminal 160.

The package substrate 110 may be arranged under the stacked chip 120 and the memory chip 130, and may support the stacked chip 120 and the memory chip 130. Although not shown, the package substrate 110 may include, but not be limited to, a redistribution substrate, a printed circuit board (PCB), a ceramic substrate, an organic substrate, an interposer substrate, and the like. However, the package substrate 110 is not limited thereto. That is, the package substrate 110 may include additional or fewer components without deviating from the scope of the present disclosure.

In the semiconductor package 100, the package substrate 110 may include, for example, a redistribution substrate (not shown). Accordingly, the package substrate 110 may rewire chip pads of the stacked chip 120 and/or the memory chip 130. Alternatively or additionally, the package substrate 110 may include a body insulating layer and/or redistribution lines (not shown).

In an embodiment, the body insulating layer may include an insulating material (e.g., photo imageable dielectric (PID) resin) and/or may also further include an inorganic filler. However, the material of the body insulating layer is not limited thereto. That is, the body insulating layer may include additional or fewer materials and/or fillers without deviating from the scope of the present disclosure.

In an optional or additional embodiment, the redistribution lines may be formed in layers and may be connected to each other by using vias. Alternatively or additionally, the body insulating layer may have a multilayered structure according to a structure of the layers of the redistribution lines. When the body insulating layer has a multilayered structure, layers of the body insulating layer may include the same material or may include different materials.

The external connection terminal 160 may be arranged under a lower surface of the package substrate 110. Alternatively or additionally, the external connection terminal 160 may be arranged on an external connection pad formed under the lower surface of the package substrate 110. In an embodiment, the external connection terminal 160 may be electrically connected (e.g., coupled) to the stacked chip 120 and to the memory chip 130 via the redistribution lines of the package substrate 110, first bump 125, and second bump 135.

For example, the stacked chip 120 may be mounted on the package substrate 110 by using the first bump 125, and the memory chip 130 may be mounted on the package substrate 110 by using the second bump 135. In an embodiment, the first bump 125 and the second bump 135 may each have a structure including a pillar and a solder. In an optional or additional embodiment, the first bump 125 and/or the second bump 135 may include only a solder.

For reference, one semiconductor chip or one stacked chip may be arranged on a redistribution substrate. The redistribution substrate may have a larger planar area than the semiconductor chip and/or the stacked chip. The external connection terminal 160 may be arranged under the lower surface of a central portion and under a periphery of the central portion corresponding to the semiconductor chip and/or the stacked chip. The chip pad of the semiconductor chip and/or a stacked chip may be rearranged on the redistribution substrate to a larger portion than the lower surface of the semiconductor chip and/or the stacked chip. In an embodiment, a package structure, in which an external connection terminal may be arranged in a wider region than a lower surface of a semiconductor chip and/or a stacked chip, may be referred to as a fan-out (FO) package structure. Alternatively or additionally, a package structure, in which an external connection terminal may be arranged only in a portion corresponding to a lower surface of a semiconductor chip and/or a stacked chip, may be referred to as a fan-in (FI) package structure.

In the semiconductor package 100, the stack chip 120 and the memory chip 130 may be arranged adjacent to each other on the package substrate 110. Thus, it may be difficult to distinguish whether the semiconductor package 100 is an FO package or an FI package. However, it may be assumed that when the package structure is based on any one of the stacked chip 120 and the memory chip 130 of the present disclosure, the semiconductor package 100 may be considered as an FO package.

In an embodiment, the stacked chip 120 may be mounted on the package substrate 110 by using the first bump 125. As shown in FIGS. 1A and 1B, the stacked chip 120 may be arranged on the right side of the package substrate 110 in a first direction (e.g., X direction), and the memory chip 130 may be arranged on the left side of the stacked chip 120 in the first direction (e.g., X direction). However, the positions of the stacked chip 120 and the memory chip 130 may be changed with one another in the first direction (e.g., X direction) without deviating from the scope of the present disclosure. For example, in the case of the stacked chip 120, the stacked chip 120 may be arranged in a structure in which a side surface of the dummy silicon chip 140 arranged in contact with an upper chip 124 is exposed in the first direction (e.g., X direction). Alternatively or additionally, the stacked chip 120 may be arranged at a central portion of the package substrate 110 in a second direction (e.g., Y direction).

In an embodiment, the stacked chip 120 may include a lower chip 122 and the upper chip 124. The lower chip 122 and the upper chip 124 may be bonded to each other by using a hybrid bonding (HB) structure, for example. In this case, the HB structure may refer to a structure formed of a combination of pad-to-pad bonding and insulator-to-insulator bonding. That is, in the pad-to-pad bonding, chip pads of the lower chip 122 may be bonded to chip pads of the upper chip 124 and, in the insulator-to-insulator bonding, insulating layers of the lower chip 122 may be bonded to insulating layers of the upper chip 124. In an embodiment, the pad-to-pad bonding may be referred to as a copper-to-copper bonding when the chip pad include copper (Cu). Alternatively or additionally, in the insulator-to-insulator bonding, an insulating layer may include, but not be limited to, silicon dioxide ($SiO_2$). However, a material of the insulating layer is not limited thereto. That is, the insulating layer may include other materials and/or combination of materials without deviating from the scope of the present disclosure.

In the semiconductor package 100, the bonding structure of the stacked chip 120 may not be limited to the HB structure. For example, the stacked chip 120 may also have a bonding structure using an anisotropic conductive film (ACF), a bonding structure using a connection member (e.g., a bump and a solder ball), and the like. In a bonding structure using the ACF, the ACF may be an anisotropic conductive film, which may be electrically conductive only in one direction. Alternatively or additionally, the ACF may be a conductive film formed in a film state by mixing fine conductive particles with adhesive resin.

In an embodiment, the lower chip 122 of the stacked chip 120 may include an analog chip. For example, the lower chip 122 may include a modem chip supporting communication of the upper chip 124. However, the type of the lower chip 122 is not limited to an analog chip or a modem chip. For example, the lower chip 122 may include various types of integrated elements supporting an operation of the upper chip 124 without deviating from the scope of the present disclosure.

Although not shown, the lower chip 122 may include a first body layer, a first integrated circuit layer, a first distribution layer, a through electrode, and the like. In an embodiment, the first body layer may constitute a body of the lower chip 122, and may be based on a silicon substrate. The first integrated circuit layer may be arranged under the first body layer, and may include a plurality of integrated elements. The first distribution layer may be arranged under the first integrated circuit layer, and may include an insulating layer and multilayered distributions in the insulating layer. The through electrode may penetrate the first body layer and be connected to the first distribution layer. In an embodiment, the through electrode may be referred to as a through silicon via (TSV) when the first body layer is based on the silicon substrate. The through electrode is described with reference to a semiconductor package 100f of FIG. 6.

In an embodiment, a lower surface of the lower chip 122 may be referred to as a front surface and/or an active surface. Alternatively or additionally, an upper surface of the lower chip 122 may be referred to as a back surface and/or an inactive surface. For example, the lower surface of the first distribution layer may correspond to the front surface of the lower chip 122, and the upper surface of the first body layer may correspond to the back surface of the lower chip 122. In an embodiment, the chip pad may be formed on the front surface of the lower chip 122, which may be an active surface. Accordingly, a first chip pad of the lower chip 122 may be formed under the lower surface of the first distribution layer, and connected to distributions of the first distribution layer.

Alternatively or additionally, a back surface pad connected to the through electrode may be formed on the back surface of the lower chip 122. For example, the back surface pad of the lower chip 122 may be bonded to a second chip pad of the upper chip 124 by using the HB structure. Accordingly, the through electrode may be connected to a second distribution layer of the upper chip 124 via the second chip pad.

In an embodiment, the upper chip 124 may include a plurality of logic elements therein. A logic element may refer to an element capable of performing various signal processing including logic circuits, such as, but not limited to, an AND gate, an OR gate, a NOT gate, and a flip-flop. In an optional or additional embodiment, the upper chip 124 may include, for example, an application processor (AP) chip. For example, the upper chip 124 may be referred to as a control chip, a process chip, a central processing unit (CPU) chip, or the like, according to its function.

Although not shown, the upper chip 124 may include a second body layer, a second integrated circuit layer, the second distribution layer, and the like. The second body layer may constitute a body of the upper chip 124, and may be based on a silicon substrate. The second integrated circuit layer may be arranged under the second body layer, and may include a plurality of integrated elements. The second distribution layer may be arranged under the second integrated circuit layer, and may include an insulating layer and multilayered distributions in the insulating layer.

In an embodiment, a lower surface of the upper chip 124 may be referred to as a front surface and/or active surface. Alternatively or additionally, an upper surface of the upper chip 124 may be referred to as a back surface and/or an inactive surface. For example, the lower surface of the second distribution layer may correspond to the front surface of the upper chip 124, and the upper surface of the second body layer may correspond to the back surface of the upper chip 124. The second chip pad of the upper chip 124 may be formed under the lower surface of the second distribution layer, and connected to distributions of the second distribution layer. Alternatively or additionally, the second chip pad may be connected to the through electrode of the lower chip 122 by being bonded to the back surface pad of the lower chip 122 by using the HB structure, for example.

In an embodiment, an upper surface of the upper chip 124 (e.g., an upper surface of the second body layer) may be exposed to the outside. That is, the upper surface of the upper chip 124 may be exposed to the encapsulant 150. For example, the upper surface of the upper chip 124 may be substantially coplanar with the upper surface of the encapsulant 150. Consequently, by exposing the upper surface of the upper chip 124 from the encapsulant 150, heat generated by the stacked chip 120 may be efficiently discharged to the outside via the upper chip 124. Alternatively or additionally, heat generated by the stacked chip 120 may be discharged via the dummy silicon chip 140 arranged in contact with the upper chip 124 on the lower chip 122.

In order to potentially improve heat dissipation efficiency via the upper chip 124, as shown in FIG. 1B, the upper chip 124 may have a thickness that is greater than a thickness of the lower chip 122 in a third direction (e.g., Z direction). For example, the upper chip 124 may have a thickness of about 0.8 mm in the third direction (e.g., Z direction). However, the thickness of the upper chip 124 is not limited in this regard. For example, as a result of the upper chip 124 having a large thickness and the upper surface of the upper chip 124 being exposed from the encapsulant 150, heat dissipation via the upper chip 124 may be smoothly performed. The discharge of heat via the upper chip 124 and the dummy silicon chip 140 is described below with reference to the dummy silicon chip 140.

The memory chip 130 may be mounted on the package substrate 110 by using the second bump 135. As described above, the memory chip 130 may be arranged on the left side of the package substrate 110 in the first direction (e.g., X direction). However, according to an embodiment, the memory chip 130 may also be arranged on the right side of the package substrate 110 in the first direction (e.g., X direction). Alternatively or additionally, as shown in FIG. 1A, the memory chip 130 may be arranged at a central portion of the package substrate 110 in the second direction (e.g., Y direction).

In an embodiment, the memory chip 130 may have a multiple stacked chip structure. However, the structure of the memory chip 130 is not limited in this regard. For example, according to an embodiment, the memory chip 130 may have a single chip structure including one chip. In an optional or additional embodiment, the memory chip 130 may have a multi-chip package (MCP) structure in which a plurality of chips may be stacked. Alternatively or additionally, the memory chip 130 may have a high bandwidth memory (HBM) package structure, which may further include a buffer chip. For example, the memory chip 130 having an MCP structure may be used in a mobile-oriented electronic device, and/or the memory chip 130 having an HBM structure may be used in a server-oriented electronic device. In another optional or additional embodiment, the memory chip 130 may have a package structure of a wire bonding type. Hereinafter, a memory chip 130 having the MCP structure is described. It may be assumed that all chips included in the MCP structure of the memory chip 130 are the same and, as such, the memory chip 130 may be treated as having one chip and described accordingly. Additionally, a memory chip 130a having the HBM package structure is described below with reference to the semiconductor package 100f of FIG. 6.

Although not shown, in an embodiment, the memory chip 130 may include a third body layer, a third integrated circuit layer, a third distribution layer, and the like. The third body layer may constitute a body of the memory chip 130, and may be based on a silicon substrate. The third integrated circuit layer may be arranged under the third body layer, and may include a plurality of integrated elements. The third distribution layer may be arranged under the third integrated circuit layer, and may include an insulating layer and multilayered distributions in the insulating layer.

The third integrated circuit layer of the memory chip 130 may include memory devices of various types. For example, the third integrated circuit layer may include, but not be limited to, a field effect transistor (FET) (e.g., a planar FET and a Fin FET), and memory elements (e.g., a flash memory, dynamic random access memory (RAM) (DRAM), static RAM (SRAM), electrically erasable programmable read-only memory (ROM) (EEPROM), phase-change RAM (PRAM), magnetoresistive RAM (MRAM), ferroelectric RAM (FeRAM), and resistive RAM (RRAM). In an embodiment, the third integrated circuit layer of the memory chip 130 may include a plurality of DRAM elements. For example, the memory chip 130 may include a DRAM chip.

In an embodiment, the lower surface of the memory chip 130 may be referred to as a front surface and/or an active surface. Alternatively or additionally, the upper surface of the memory chip 130 may be referred to as a back surface and/or an inactive surface. For example, a lower surface of the third distribution layer may correspond to the front surface of the memory chip 130, and an upper surface of the third body layer may correspond to the back surface of the memory chip 130. The third chip pad of the memory chip 130 may be formed under the lower surface of the third distribution layer, and connected to distributions of the third distribution layer. Alternatively or additionally, the third chip pad may be connected to the substrate pad of the package substrate 110 via the second bump 135.

The dummy silicon chip 140 may be stacked on the lower chip 122 of the stacked chip 120 by using an adhesive layer 145. As shown in FIGS. 1A and 1B, a top surface of the dummy silicon chip 140 and the right side surface of the dummy silicon chip 140 in the first direction (e.g., X direction) may be exposed from the encapsulant 150. When the stacked chip 120 is arranged on the left side of the memory chip 130 in the first direction (e.g., X direction) on the package substrate 110, the left side surface of the dummy silicon chip 140 may be exposed from the encapsulant 150 in the first direction (e.g., X direction).

When the thickness of the adhesive layer 145 is negligible, the thickness of the dummy silicon chip 140 in the third direction (e.g., Z direction) may be substantially the same as the thickness of the upper chip 124. When the thickness of the adhesive layer 145 is considered, the thickness of the dummy silicon chip 140 in the third direction (e.g., Z direction) may have a value obtained by subtracting the thickness of the adhesive layer 145 from the thickness of the upper chip 124. The adhesive layer 145 of the semiconductor package 100 of FIG. 1A and of the semiconductor package 100a of FIG. 2 have been omitted for the sake of simplicity.

In an embodiment, the dummy silicon chip 140 may serve as a medium for heat dissipation of the stacked chip 120. That is, heat generated by the stacked chip 120 may be dissipated via the dummy silicon chip 140. Hereinafter, the heat dissipation via the dummy silicon chip 140 is described in detail. In a related semiconductor package, a semiconductor chip may be encapsulated by an encapsulant. The encapsulant of the related semiconductor package may include a resin, such as epoxy mold compound (EMC). However, the thermal conductivity of the resin (e.g., EMC) may be low. For example, EMC may have a thermal conductivity of approximately 0.02 Watts per meter per Kelvin (W/mK) to approximately 0.04 W/mK. Accordingly, when both the upper side and the side surfaces of a semiconductor chip are surrounded by EMC and heat is generated in the semiconductor chip, dissipation of heat generated by the semiconductor chip may be comparatively low.

In the case of silicon constituting the semiconductor chip, the thermal conductivity of the semiconductor chip may be better (e.g., higher) than the thermal conductivity of EMC. For example, the thermal conductivity of silicon may be approximately 2 W/mK to approximately 10 W/mK. That is, the thermal conductivity of the semiconductor chip may be approximately 100 times higher than the thermal conductivity of EMC. In an embodiment, the stacked chip 120 may generate a large amount of heat. For example, in the case of the upper chip 124, when logic elements of the second integrated circuit layer perform logic operations in particular, a large amount of heat may be generated. Accordingly, by exposing the upper surface of the upper chip 124 without covering the upper surface with the encapsulant 150, heat dissipation efficiency of the semiconductor package 100 may be increased.

As the upper surface of the upper chip 124 may be an inactive surface, exposing the upper surface of the upper chip 124 may not cause an issue. However, in the case of the side surfaces of the upper chip 124, an active surface may occur in a lower portion of the side surfaces. Therefore, it may be preferable to prevent the side surfaces of the upper chip 124 from being exposed to the outside. Accordingly, the dummy silicon chip 140 may be arranged adjacent to the upper chip 124, so that the upper chip 124 may dissipate heat via the upper surface thereof and via the dummy silicon chip 140. As a result, the heat dissipation efficiency of the semiconductor package 100 may be maximized.

Referring to FIG. 1C, arrows represent paths through which heat generated by lower portions of the lower chip 122 and the upper chip 124 may be emitted. The length of an arrow may represent heat dissipation performance. That is, as the length of the arrow is increased, the heat dissipation performance may be increased. As shown in FIG. 1C, the heat dissipation performance via the upper surface of upper chip 124 and via the dummy silicon chip 140 may be higher than via the encapsulant 150.

In an embodiment, in order to maximize heat dissipation characteristics via the dummy silicon chip 140, the dummy silicon chip 140 may include a metal, such as, but not limited to, copper (Cu), aluminum (Al), and nickel (Ni). However, the type of the metal is not limited thereto. That is, the dummy silicon chip 140 may include other metals and/or combination of metals without deviating from the scope of the present disclosure. For example, according to an embodiment, the dummy silicon chip 140 may include a metal path including a metal. The end of the metal path may be exposed to the outside of the dummy silicon chip 140. Alternatively or additionally, the semiconductor package 100 may further include a heat sink (not shown) in contact with the dummy silicon chip 140. In some embodiments, when the dummy silicon chip 140 includes a metal sink, the heat sink may be connected to the metal path.

In an embodiment, the dummy silicon chip 140 may be bonded to the lower chip 122 by using the adhesive layer 145. The adhesive layer 145 may include a material having high thermal conductivity so that heat may be easily dissipated from the lower chip 122. For example, the adhesive layer 145 may include, but not limited to, a thermal interface material (TIM). The TIM may include a material having high thermal conductivity. That is, the TIM may include a material having low thermal resistance, such as, but not limited to, grease, tape, an elastomer filling pad, a phase transition material, and the like. However, the material of the TIM is not limited in this regard. That is, the TIM may include other materials or combination of materials having a low thermal resistance without deviating from the scope of the present disclosure.

In an embodiment, by keeping the upper chip 124 thick when compared to the lower chip 122, and including the dummy silicon chip 140, the volume occupied by the encapsulant 150 in the whole package may be relatively small. Consequently, by reducing the volume occupied by the encapsulant 150, warpage of the whole semiconductor package may be reduced. For example, the thermal expansion rate of silicon constituting the stacked chip 120 and the memory chip 130 may be approximately $90 \times 10^{-7}$/K, and the thermal expansion rate of EMC constituting the encapsulant 150 may be approximately $500 \times 10^{-7}$/K to approximately $900 \times 10^{-7}$/K. When the package substrate 110 includes a redistribution substrate, the package substrate 110 may include a material having a similar thermal expansion rate to that of silicon. Accordingly, by minimizing the volume occupied by the encapsulant 150, warpage due to the difference in the thermal expansion rates between the encapsulant 150 and the stacked chip 120 and the memory chip 130 and/or between the encapsulant 150 and the package substrate 110 may be reduced.

In an embodiment, the encapsulant 150 may cover and encapsulate the stacked chip 120, the memory chip 130, and the dummy silicon chip 140, which are on the package substrate 110. The encapsulant 150 may cover the side surfaces of the stacked chip 120 and the dummy silicon chip 140, but may not cover (e.g., expose) the upper surfaces of the stacked chip 120 and the dummy silicon chip 140. Alternatively or additionally, the encapsulant 150 may cover the upper surface and the side surfaces of the memory chip 130.

As shown in FIG. 1B, the encapsulant 150 may fill a space between the package substrate 110 and the stacked chip 120 and spaces between first bumps 125 under the lower surface of the stacked chip 120. Alternatively or additionally, the encapsulant 150 may fill a space between the package substrate 110 and the memory chip 130 and spaces between second bumps 135 under the lower surface of the memory chip 130. In some optional or additional embodiments, an underfill (not shown) may fill the spaces between the first bump 125 and the lower surface of the stacked chip 120. The underfill may also fill the spaces between the second bump 135 and the lower surface of the memory chip 130. In such embodiments, the encapsulant 150 may cover the underfill.

The encapsulant 150 may include a thermosetting material such as, but not limited to, an epoxy resin or a thermoplastic resin such as a polyimide. Alternatively or additionally, the encapsulant 150 may include a resin, such as, but not limited to, a thermosetting resin or a thermoplastic resin, that contains a reinforcement material such as an inorganic filler (e.g., Ajinomoto build-up film (ABF), flame retardant 4 (FR-4), bismaleimide triazine (BT) resin, and the like). In an embodiment, the encapsulant 150 may include a photosensitive material such as, but not limited to, a photo imageable encapsulant (PIE). However, the material of the encapsulant 150 is not limited in this regard. For example, the encapsulant 150 may include EMC.

The external connection terminal 160 may be arranged on an external connection pad under the lower surface of the package substrate 110. The external connection terminal 160 may be electrically connected (e.g., coupled) to a redistribution line of the package substrate 110 via the external connection pad. The external connection terminal 160 may mount the semiconductor package 100 on a package substrate of an outside system, and/or a main board of an electronic device, such as, but not limited to, a mobile device. The external connection terminal 160 may include at least one of conductive materials, such as, but not limited to, a solder, tin (Sn), silver (Ag), copper (Cu), and aluminum (Al).

In an embodiment, the stacked chip 120 may include the lower chip 122 and an upper chip 124. The upper chip 124 may have a large thickness and include an upper surface exposed from the encapsulant 150. Alternatively or additionally, the dummy silicon chip 140 may be arranged in contact with the upper chip 124 on the lower chip 122, and the upper surface and one side surface of the dummy silicon chip 140 may be exposed from the encapsulant 150. Consequently, heat generated by the stacked chip 120, particularly, heat generated by the second integrated circuit layer of the upper chip 124, may be effectively dissipated through the upper surface of the upper chip 124, and the upper surface and the side surfaces of the dummy silicon chip 140. Accordingly, the heat dissipation efficiency of the semiconductor package 100 may be maximized. As a result, based on the maximized heat dissipation efficiency, the semiconductor package 100 may have improved operating performance and reliability, when compared to related semiconductor packages. For example, the improved operation performance of the semiconductor package 100 may include improvement of signal integrity (SI), performance ratio (performance/power consumption), and the like.

Figure 2:
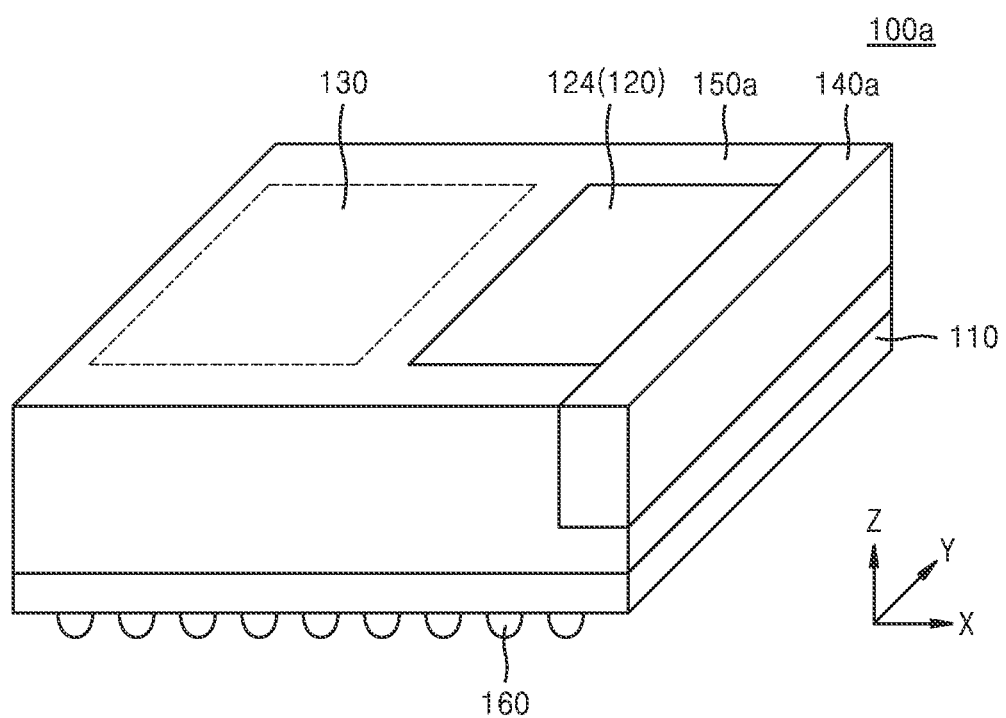
FIG. 2 is a schematic perspective view of a structure of a semiconductor package, according to an embodiment.

FIG. 2 is a schematic perspective view of a structure of the semiconductor package 100a, according to an embodiment. The semiconductor package 100a of FIG. 2 may include or may be similar in many respects to semiconductor package 100 described above with reference to FIGS. 1A to 1C and may include additional features not mentioned above. Thus, descriptions of features discussed with reference to FIGS. 1A through 1C are briefly given or omitted for the sake of brevity.

Referring to FIG. 2, the semiconductor package 100a may be different from the semiconductor package 100 of FIG. 1B, with respect to the structure of a dummy silicon chip 140a. The semiconductor package 100a may include the package substrate 110, the stacked chip 120, the memory chip 130, the dummy silicon chip 140a, an encapsulant 150a, and the external connection terminal 160. The package substrate 110, the stacked chip 120, the memory chip 130, and the external connection terminal 160 of the semiconductor package 100a may include or may be similar in many respects to the corresponding elements described above with reference to the semiconductor package 100 of FIG. 1B.

In an embodiment, the dummy silicon chip 140a may be arranged in contact with the side surface of the upper chip 124 on the lower chip 122 so that the right side surface of the dummy silicon chip 140a is exposed from the encapsulant 150a in the first direction (e.g., X direction). When the stacked chip 120 is arranged on the left side of the memory chip 130 on the package substrate 110 in the first direction (e.g., X direction), the dummy silicon chip 140a may be arranged in contact with the side surfaces of the upper chip 124 and the lower chip 122 so that the left side surface of the dummy silicon chip 140a is exposed from the encapsulant 150a in the first direction (e.g., X direction).

In an embodiment, the length of the dummy silicon chip 140a in the second direction (e.g., Y direction) may be substantially the same as the length of the package substrate 110 and/or the encapsulant 150a. Accordingly, both side surfaces of the dummy silicon chip 140a may be exposed in the second direction (e.g., Y direction). Alternatively or additionally, the encapsulant 150a may cover a portion of a lower surface of the dummy silicon chip 140a and a portion of the left side surface thereof in the first direction (e.g., X direction). That is, a portion of the lower surface of the dummy silicon chip 140a may refer to a lower surface of a portion protruding from the lower chip 122. In addition, a portion of the left side surface of the dummy silicon chip 140a in the first direction (e.g., X direction) may refer to the left side surface in the first direction (e.g., X direction) from the portions protruding to both sides of the upper chip 124 in the second direction (e.g., Y direction).

In the semiconductor package 100a, by exposing both side surfaces of the dummy silicon chip 140a in the second direction (e.g., Y direction), heat generated by the stacked chip 120 may be easily dissipated through both side surfaces of the dummy silicon chip 140a in the second direction (e.g., Y direction). Alternatively or additionally, the dummy silicon chip 140a may have a 'ㄴ'-shaped structure in a plan view, and may also be arranged in a structure to be in contact with three sides of the upper chip 124 and surround the upper chip 124 on the lower chip 122. By arranging the dummy silicon chip 140a in such a structure, heat generated by the stacked chip 120 may be easily dissipated through the dummy silicon chip 140a.

Figure 3A:
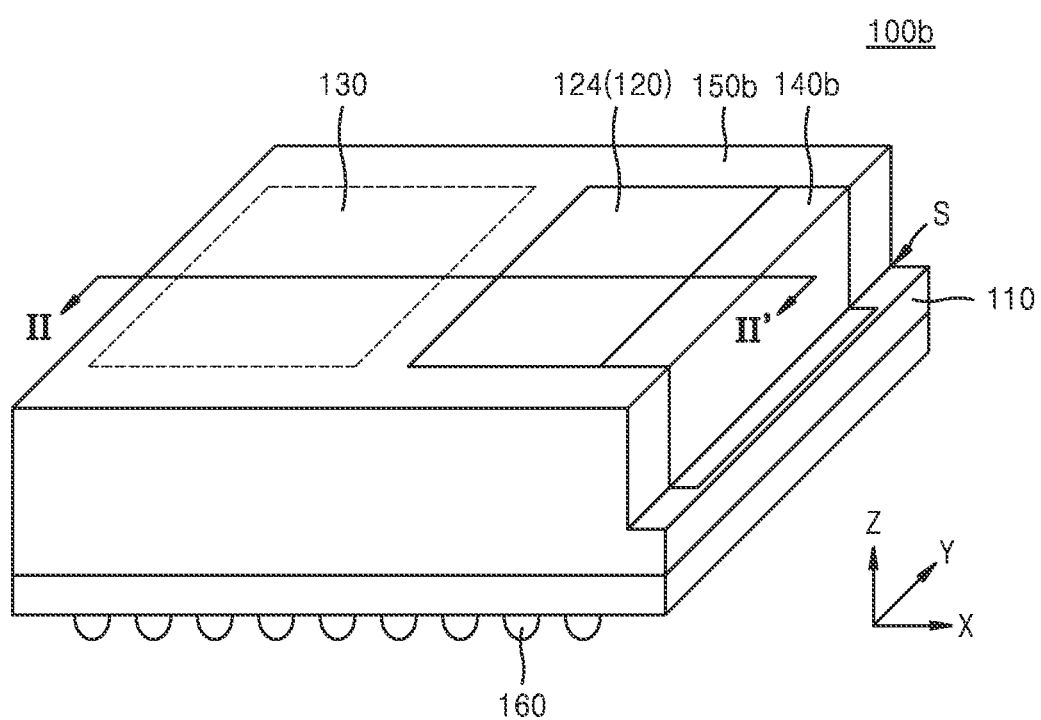
FIGS. 3A and 3B are a perspective view and a cross-sectional view, respectively, schematically illustrating a structure of a semiconductor package, according to an embodiment.
Figure 3B:
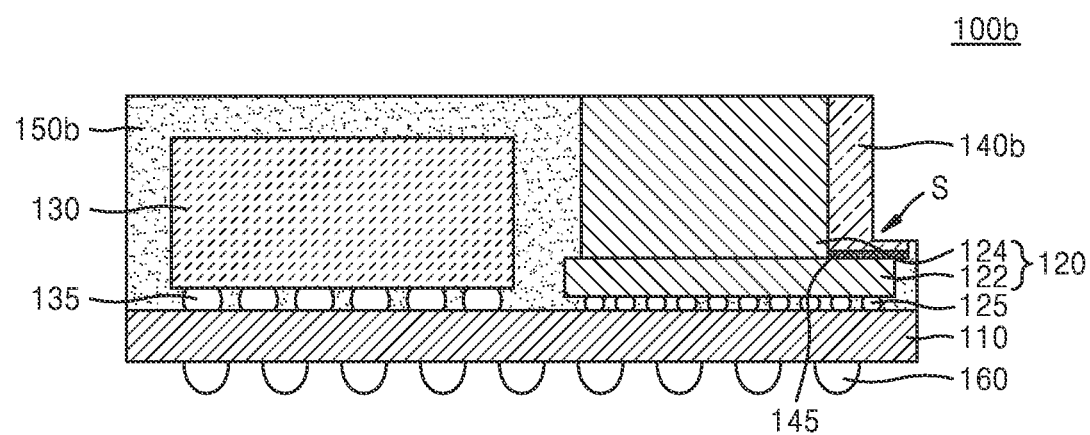

FIG. 3A is a schematic perspective view of a structure of a semiconductor package 100b, according to an embodiment. FIG. 3B is a cross-sectional view taken along line II-IF in FIG. 3A, according to an embodiment. The semiconductor package 100b may include or may be similar in many respects to at least one of the semiconductor package 100 described above with reference to FIGS. 1A to 1C and the semiconductor package 100a of FIG. 2, and may include additional features not mentioned above. Thus, descriptions of features discussed with reference to FIGS. 1A through 2 are briefly given or omitted for the sake of brevity.

Referring to FIGS. 3A and 3B, the semiconductor package 100b may be different from the semiconductor package 100 of FIG. 1B, with respect to a structure of a dummy silicon chip 140b. The semiconductor package 100b may include the package substrate 110, the stacked chip 120, the memory chip 130, the dummy silicon chip 140b, an encapsulant 150b, and the external connection terminal 160. The package substrate 110, the stacked chip 120, the memory chip 130, and the external connection terminal 160 of the semiconductor package 100b may include or may be similar in many respects to the corresponding elements described above with reference to the semiconductor package 100 of FIG. 1B.

In an embodiment, the dummy silicon chip 140b and the encapsulant 150b may have a step S formed on the right side surface of the semiconductor package 100b in the first direction (e.g., X direction). That is, the width of the upper portion of the dummy silicon chip 140b and the encapsulant 150b in the first direction (e.g., X direction) may be less (e.g., narrower) than the width of the lower portion thereof in the first direction (e.g., X direction). The step S of the dummy silicon chip 140b and the encapsulant 150b may be formed by using a two-step cutting process during the manufacturing process of the semiconductor package 100b. The two-step cutting process is described below with reference to FIGS. 9A through 9C.

In an embodiment, an upper surface and a right side surface of the dummy silicon chip 140b may be exposed in the first direction (e.g., X direction). However, as the dummy silicon chip 140b includes the step S, the upper surface of the dummy silicon chip 140b may include a first upper surface on an upper portion of the dummy silicon chip 140b and a second upper surface on a lower portion of the dummy silicon chip 140b. The first upper surface of the dummy silicon chip 140b may be substantially coplanar with the upper surface of the upper chip 124. The second upper surface of the dummy silicon chip 140b may be coplanar with the upper surface of the step S portion of the encapsulant 150b.

In an embodiment, the exposed side surface of the dummy silicon chip 140b may be adjacent to the upper chip 124 in the first direction (e.g., X direction). Accordingly, heat generated by the upper chip 124 may be easily dissipated through the side surface of the dummy silicon chip 140b. Alternatively or additionally, as the right side portion of the lower chip 122 is adjacent to the upper surface of the step S portion of the dummy silicon chip 140b, heat generated by the lower chip 122 may be easily dissipated through the second upper surface of the dummy silicon chip 140b.

Figure 4:
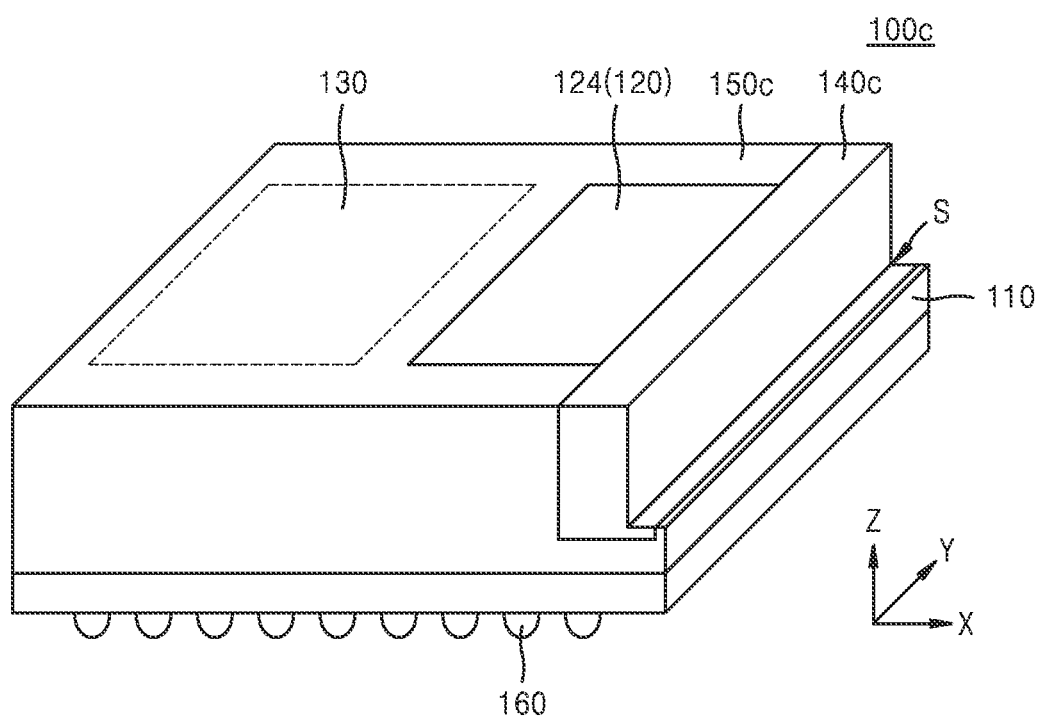
FIG. 4 is a schematic perspective view of a structure of a semiconductor package, according to an embodiment.

FIG. 4 is a schematic perspective view of a structure of a semiconductor package 100c, according to an embodiment. The semiconductor package 100c may include or may be similar in many respects to at least one of the semiconductor packages discussed above with reference to FIGS. 1A through 3B, and may include additional features not mentioned above. Thus, descriptions of features discussed above with reference to FIGS. 1A through 3B are briefly given or omitted for the sake of brevity.

Referring to FIG. 4, the semiconductor package 100c may be different from the semiconductor package 100 of FIG. 1B, with respect to the structure of a dummy silicon chip 140c. The semiconductor package 100c may include the package substrate 110, the stacked chip 120, the memory chip 130, the dummy silicon chip 140c, an encapsulant 150c, and the external connection terminal 160. The package substrate 110, the stacked chip 120, the memory chip 130, and the external connection terminal 160 of the semiconductor package 100c may include or may be similar in many respects to the corresponding elements described above with reference to the semiconductor package 100 of FIG. 1B.

In an embodiment, the length of the dummy silicon chip 140c in the second direction (e.g., Y direction) may be substantially the same as the length of the package substrate 110 and/or the encapsulant 150c. Accordingly, both side surfaces of the dummy silicon chip 140c may be exposed in the second direction (e.g., Y direction). Alternatively or additionally, in the semiconductor package 100c of the present embodiment, the dummy silicon chip 140c and the encapsulant 150c may have a step S formed on the right side surface in the first direction (e.g., X direction).

The encapsulant 150c may cover a portion of the lower surface of the dummy silicon chip 140c, a portion of the left side surface of the dummy silicon chip 140c in the first direction (e.g., X direction), and a portion of the right side surface the dummy silicon chip 140c in the first direction (e.g., X direction). For example, a portion of the lower surface of the dummy silicon chip 140c may refer to a lower surface of a portion protruding from the lower chip 122. In addition, a portion of the left side surface of the dummy silicon chip 140c in the first direction (e.g., X direction) may refer to the left side surface in the first direction (e.g., X direction) from the portions protruding to both sides of the upper chip 124 in the second direction (e.g., Y direction). Alternatively or additionally, the portion of the right side surface in the first direction (e.g., X direction) may refer to the right side surface of the lower portion of the dummy silicon chip 140c including the step S formed therein, and the encapsulant 150c may cover the right side surface of the lower portion of the dummy silicon chip 140c. In some embodiments, the lower portion of the dummy silicon chip 140c may also have an exposed structure.

In optional or additional embodiments, as the length of the dummy silicon chip 140a in the second direction (e.g., Y direction) may be substantially the same as the length of the encapsulant 150c, the step S portion of the encapsulant 150c may have a structure extending from the step S portion to the outside of the dummy silicon chip 140c in the first direction (e.g., X direction).

In an embodiment, the heat dissipation characteristics described above with reference to the semiconductor package 100a of FIG. 2 and the semiconductor package 100b of FIG. 3A may be applied in combination. That is, by exposing both sides of the dummy silicon chip 140c in the second direction (e.g., Y direction), heat generated by the stacked chip 120 may be easily dissipated through both sides of the dummy silicon chip 140c in the second direction (e.g., Y direction). In addition, as the exposed side of the dummy silicon chip 140c is adjacent to the upper chip 124 in the first direction (e.g., X direction) and the right side portion of the lower chip 122 is adjacent to the upper surface of the step S portion of the dummy silicon chip 140c, heat generated by the stacked chip 120 may be easily dissipated through the dummy silicon chip 140c.

Alternatively or additionally, the dummy silicon chip 140c may have a 'ㄷ'-shaped structure in a plan view, and may be arranged in a structure to be in contact with three sides of the upper chip 124 and surround the upper chip 124 on the lower chip 122. By arranging the dummy silicon chip 140c in such a structure, heat generated by the stacked chip 120 may be easily dissipated through the dummy silicon chip 140c.

Figure 5A:
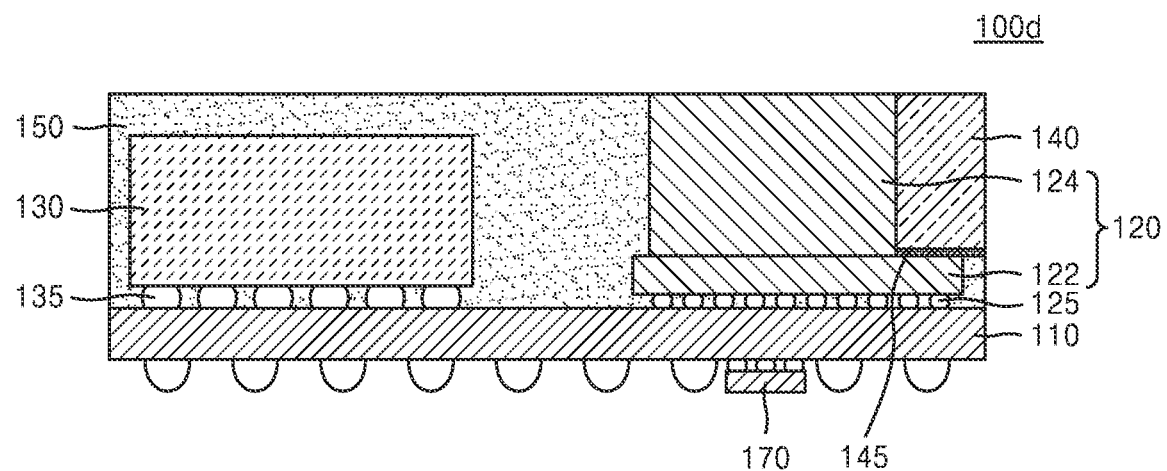
FIGS. 5A and 5B are schematic cross-sectional views of structures of semiconductor packages, according to an embodiment.
Figure 5B:
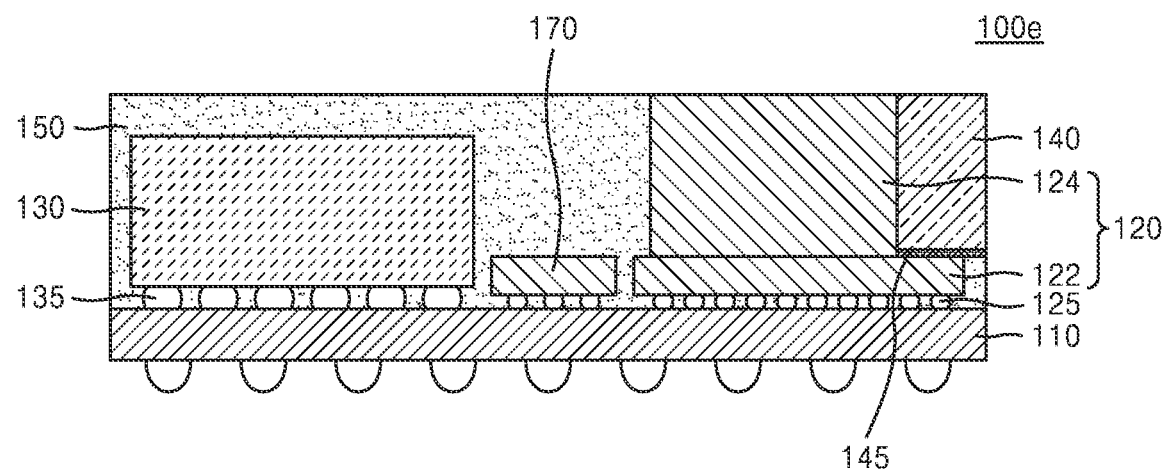

FIGS. 5A and 5B are schematic cross-sectional views of structures of semiconductor packages 100d and 100e, respectively, according to embodiments. The semiconductor packages 100d and 100e may include or may be similar in many respects to at least one of the semiconductor packages discussed above with reference to FIGS. 1A through 4, and may include additional features not mentioned above. Thus, descriptions of features discussed above with reference to FIGS. 1A through 4 are briefly described or omitted for the sake of brevity.

Referring to FIG. 5A, the semiconductor package 100d may be different from the semiconductor package 100 of FIG. 1B, from an aspect that a passive element 170 is further included. The semiconductor package 100d may include the package substrate 110, the stacked chip 120, the memory chip 130, the dummy silicon chip 140, the encapsulant 150, the external connection terminal 160, and the passive element 170. The package substrate 110, the stacked chip 120, the memory chip 130, the dummy silicon chip 140, the encapsulant 150, and the external connection terminal 160 of the semiconductor package 100*d* may include or may be similar in many respects to the corresponding elements described above with reference to the semiconductor package 100 of FIG. 1B.

In an embodiment, the passive element 170 may be arranged under the lower surface of the package substrate 110. The passive element 170 may include two-terminal elements, such as, but not limited to, a resistor, a capacitor, and an inductor. In FIG. 5A, one passive element 170 may be arranged. However, the number of passive elements 170 arranged under the lower surface of the package substrate 110 is not limited thereto. For example, the passive element 170 of the semiconductor package 100*d* may include a silicon capacitor and/or a multi-layer ceramic capacitor (MLCC). However, the passive element 170 is not limited in this regard. That is, the passive element 170 may include additional, fewer, or different elements without deviating from the scope of the present disclosure.

Referring to FIG. 5B, the semiconductor package 100*e* may be different from the semiconductor package 100*d* of FIG. 5A, from an aspect that the passive element 170 is arranged on the upper surface of the package substrate 110. As shown in FIG. 5B, at least one passive element 170 may be arranged. However, the number of passive elements 170 arranged on the upper surface of the package substrate 110 is not limited thereto. In addition, although the passive element 170 is arranged between the stacked chip 120 and the memory chip 130, the arrangement location of the passive element 170 is not limited thereto. For example, the passive element 170 may be arranged anywhere in a free space on the upper surface of the package substrate 110. Furthermore, when the passive element 170 is arranged on the upper surface of the package substrate 110, the passive element 170 may be encapsulated by the encapsulant 150.

As shown in FIGS. 5A and 5B, the passive element 170 may be arranged under the lower surface and/or on the upper surface of the package substrate 110. However, the arrangement location of the passive element 170 is not limited thereto. For example, the passive element 170 may also be arranged inside the package substrate 110.

Figure 6:
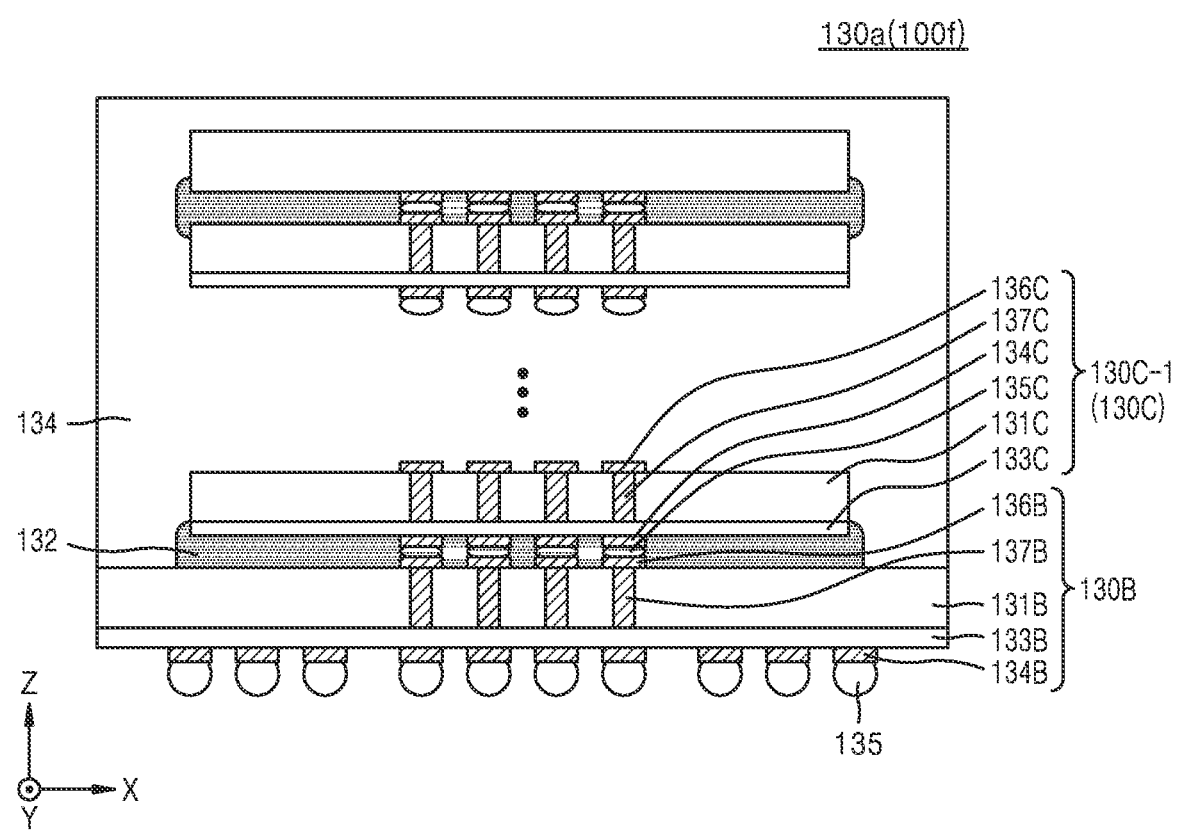
FIG. 6 is a schematic cross-sectional view of a structure of a semiconductor package, according to an embodiment.

FIG. 6 is a schematic cross-sectional view of a structure of a semiconductor package 100*f*, according to an embodiment. The semiconductor package 100*f* may include or may be similar in many respects to at least one of the semiconductor packages discussed above with reference to FIGS. 1A through 5B, and may include additional features not mentioned above. Thus, descriptions of features discussed above with reference to FIGS. 1A through 5 are briefly given or omitted for the sake of brevity.

Referring to FIG. 6, the semiconductor package 100*f* may be different from the semiconductor package 100 of FIG. 1B, from an aspect that a memory chip 130*a* has an HBM package structure. The semiconductor package 100*f* may include the package substrate 110, the stacked chip 120, the memory chip 130*a*, the dummy silicon chip 140, the encapsulant 150, the external connection terminal 160, and the passive element 170. The package substrate 110, the dummy silicon chip 140, the encapsulant 150, and the external connection terminal 160 of the semiconductor package 100*f* may include or may be similar in many respects to the corresponding elements described above with reference to the semiconductor package 100 of FIG. 1B.

In an embodiment, the memory chip 130*a* may include a buffer chip 130B, a core chip 130C, and an encapsulant 134. The buffer chip 130B may be arranged at the lowest portion of the memory chip 130*a*. The buffer chip 130B may have a size larger than that of the core chips 130C disposed upward. However, the size of the buffer chip 130B is not limited thereto. For example, the buffer chip 130B may also have substantially the same size as the core chips 130C.

The buffer chip 130B may include a substrate 131B, a distribution layer 133B, and a through electrode 137B. The substrate 131B may include, for example, a silicon substrate. However, the substrate 131B is not limited thereto. For example, the substrate 131B may include another semiconductor element, such as, but not limited to, germanium (Ge), or a compound semiconductor, such as, but not limited to, silicon carbide (SiC), gallium arsenide (GaAs), indium arsenide (InAs), and indium phosphide (InP).

The substrate 131B may include a body layer and an integrated circuit layer. The body layer may constitute a body of the buffer chip 130B. The integrated circuit layer may be arranged under the body layer, and may include a plurality of logic elements. Accordingly, the buffer chip 130B may be referred to as a logic chip or a control chip. The buffer chip 130B may be arranged under the core chips 130C. The buffer chip 130B may integrate and transmit to the outside the signals of the core chips 130C. Alternatively or additionally, the buffer chip 130B may transmit the signals and power from the outside to the core chips 130C. According to an embodiment, the buffer chip 130B may include a buffer memory element and a general memory element (not shown).

The distribution layer 133B may be arranged under the substrate 131B. That is, the distribution layer 133B may be arranged under the integrated circuit layer of the substrate 131B. The distribution layer 133B may include an insulating layer and multiple distributions in the insulating layer.

The through electrode 137B may be arranged in a structure, in which the through electrode 137B penetrates the substrate 131B. For example, as the substrate 131B includes silicon, the through electrode 137B may be referred to as a TSV. In the semiconductor package 100*f*, the through electrode 137B may have a via-middle structure. However, the through electrode 137B is not limited thereto, and may also have a via-first or via-last structure. In this case, the via-first structure may be referred to as a structure in which a through electrode has been formed before an integrated circuit layer is formed. The via-middle structure may be referred to as a structure in which a through electrode has been formed after an integrated circuit layer is formed and before a distribution circuit layer is formed. Alternatively or additionally, the via-last structure may be referred to as a structure in which a through electrode is formed after a distribution layer is formed. In the semiconductor package 100*f*, as a result of the via-middle structure, the through electrode 137B may penetrate the substrate 131B including the integrated circuit layer and extend to the distribution layer 133B.

A lower surface of the through electrode 137B may be connected to a lower electrode pad 134B, and an upper surface of the through electrode 137B may be connected to an upper electrode pad 136B. As shown in FIG. 6, the lower surface of the through electrode 137B may be connected to the lower electrode pad 134B via the distribution layer 133B. Alternatively or additionally, the upper surface of the through electrode 137B may be directly connected to the upper electrode pad 136B. In an embodiment, a passivation layer (not shown) may be formed on the upper surface of the substrate 131B and under the lower surface of the distribution layer 133B, and the lower electrode pad 134B and the upper electrode pad 136B may be exposed from the passivation layer. The second bump 135 may be arranged on the lower electrode pad 134B, and a bump 135C of the core chip 130C may be arranged on the upper electrode pad 136B.

The second bump 135 may be connected to the through electrode 137B via the lower electrode pad 134B and the distribution layer 133B. The second bump 135 may include, for example, copper (Cu), aluminum (Al), silver (Ag), tin (Sn), gold (Au), a solder, and the like. However, the material of the second bump 135 is not limited thereto. Alternatively or additionally, the second bump 135 may include a multilayer or single layer. For example, when the second bump 135 is formed as a multilayer, the second bump 135 may include a copper (Cu) filler and a solder. When the second bump 135 is formed as a single layer, the second bump 135 may include a tin-silver (Sn—Ag) solder or copper (Cu), for example.

The core chip 130C may be stacked by using the bump 135C and an adhesive layer 132 on the buffer chip 130B, and/or another core chip 130C may be arranged thereunder. The core chip 130C may be similar in many respects to the buffer chip 130B. In an embodiment, the core chip 130C may include a plurality of memory elements in the integrated circuit layer. For example, the plurality of memory elements may include one or more volatile memory elements, such as, but not limited to, DRAM and SRAM, and/or one or more non-volatile memory elements, such as, but not limited to, PRAM, MRAM, FeRAM, and RRAM. That is, the core chip 130C may include a memory chip.

The core chip 130C may include a substrate 131C, a distribution layer 133C, the bump 135C, and a through electrode 137C. The substrate 131C may include a silicon substrate, and may include a body layer and an integrated circuit layer. In an embodiment, the distribution layer 133C may include an interlayer insulating layer and multiple distribution layers. A lower electrode pad 134C, an upper electrode pad 136C, and the through electrode 137C may be similar in many respects to the lower electrode pad 134B, the upper electrode pad 136B, and the through electrode 137B of the buffer chip 130B, respectively. In an optional or additional embodiment, a bump 135C may be arranged on the lower electrode pad 134C.

In the memory chip 130a, eight core chips 130C may be stacked on the buffer chip 130B. However, the number of core chips 130C stacked on the buffer chip 130B is not limited thereto. For example, one to seven or nine or more core chips 130C may be stacked on the buffer chip 130B.

In an embodiment, the core chip 130C may include an HBM chip including DRAM elements. Accordingly, the memory chip 130a may have an HBM package structure. The memory chip 130a having the HBM package structure may be manufactured by stacking individual HBM chips respectively corresponding to buffer chips 130B in a wafer state. That is, the memory chip 130a may be manufactured by stacking the core chips 130C, encapsulating the encapsulant 134, and using a sawing process to individualize the encapsulated core chips 130C.

In an embodiment, the encapsulant 134 may cover and encapsulate the core chips 130C and the adhesive layer 132 on the buffer chip 130B. The encapsulant 134 may encapsulate the core chips 130C to protect the core chips 130C from external physical and/or chemical damage. The encapsulant 134 may include, for example, EMC. However, the encapsulant 134 is not limited thereto, and may include various materials, such as epoxy-based materials, thermosetting materials, thermoplastic materials, and ultraviolet (UV) curable materials. Alternatively or additionally, the encapsulant 134 may include resin, and/or may contain a filler. As shown in FIG. 6, the encapsulant 134 may cover the upper surface of the core chip 130C arranged at the uppermost portion. However, the embodiment is not limited thereto, and the encapsulant 134 may not cover the upper surface of the core chip 130C at the uppermost portion. That is, the upper surface of the core chip 130C at the uppermost portion may be exposed from the encapsulant 134.

FIGS. 7A through 7I are schematic cross-sectional views of a process of manufacturing at least one of the semiconductor package 100 of FIGS. 1B and 2, according to embodiments. FIGS. 7A through 7I are described with reference to FIGS. 1B and 2. Furthermore, descriptions of features described above with reference to FIGS. 1A through 6 are briefly given or omitted for the sake of brevity.

Figure 7A:
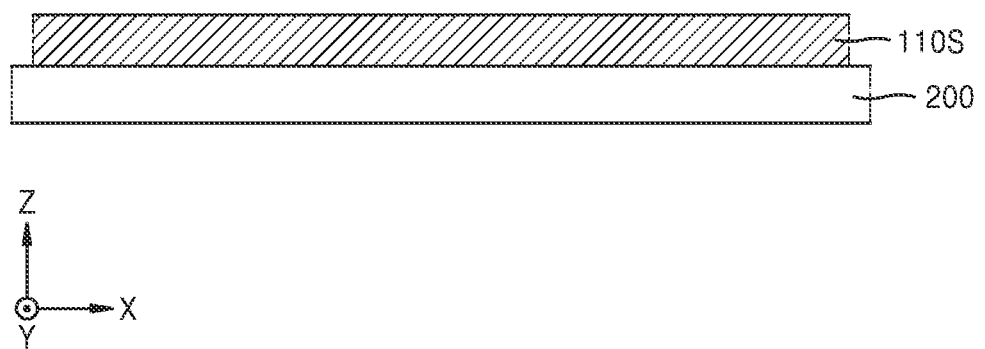
FIGS. 7A through 7I are schematic cross-sectional views of a process of manufacturing the semiconductor package of FIG. 1B or FIG. 2, according to an embodiment.

Referring to FIG. 7A, in the method of manufacturing the semiconductor package 100, firstly, a package substrate 110S may be formed. The package substrate 110S may include, for example, a redistribution substrate. Alternatively or additionally, the package substrate 110S may include a body insulating layer and redistribution lines. The package substrate 110S may be formed on a first carrier substrate 200. In an embodiment, the first carrier substrate 200 may have a large size such as a wafer. Alternatively or additionally, the package substrate 110S formed on the first carrier substrate 200 may have a large size and may include a plurality of package substrates 110. For example, after subsequent components are formed on a large-sized package substrate (e.g., package substrate 110S), a semiconductor package individualized by using a singulation process may be referred to as a wafer level package (WLP).

Figure 7B:
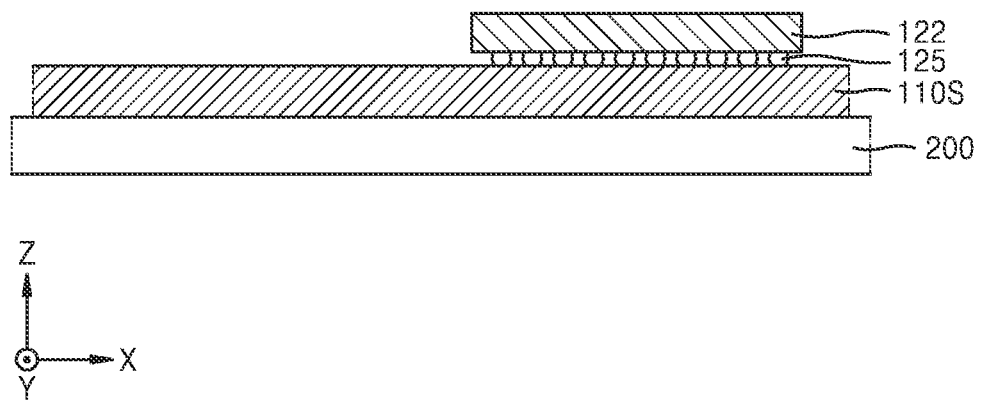

Referring to FIG. 7B, after the package substrate 110S is formed, the lower chip 122 of the stacked chip 120 may be mounted on the package substrate 110S. The lower chip 122 may be mounted on the package substrate 110S by using the first bump 125. As shown in FIG. 7B, the lower chip 122 may be arranged on the right side of the package substrate 110 in the first direction (e.g., X direction). However, the present disclosure is not limited in this regard. For example, the lower chip 122 may also be arranged on the left side of the package substrate 110 in the first direction (e.g., X direction). Although one lower chip 122 is shown in FIG. 7B, one lower chip 122 may be mounted one by one in a portion corresponding to the individual package substrate 110 included in the package substrate 110S.

In an embodiment, the lower chip 122 may include an analog chip. For example, the lower chip 122 may include a modem chip supporting communication of the upper chip 124. However, the type of the lower chip 122 is not limited to an analog chip or a modem chip. For example, the lower chip 122 may include various types of integrated elements supporting an operation of the upper chip 124.

Figure 7C:
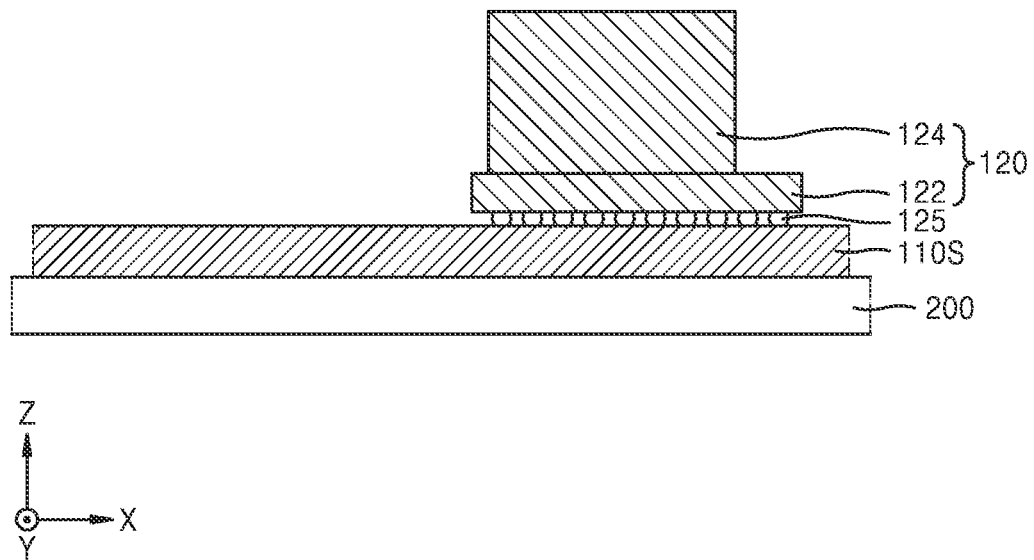

Referring to FIG. 7C, the upper chip 124 may be stacked on the lower chip 122. For example, the upper chip 124 may, in an HB structure, be stacked and bonded onto the lower chip 122. However, the bonding of the upper chip 124 is not limited to the HB structure. For example, the upper chip 124 may be stacked and bonded onto the lower chip 122 by using a bonding structure using the ACF or a bonding structure using a connection member, such as a bump and a solder ball.

The upper chip 124 may include, for example, an AP chip. The upper chip 124 may be referred to as a control chip, a process chip, a CPU chip, or the like, according to its function.

The upper chip 124 may be arranged one by one on the corresponding lower chip 122. In addition, as shown in FIG. 7C, the upper chip 124 may be arranged biased toward the left side in the first direction (e.g., X direction) on the lower chip 122. Accordingly, there may be a certain amount of free space in the right portion of the lower chip 122 in the first direction (e.g., X direction). By combining the upper chip 124 to the lower chip 122, the stacked chip 120 may be completed. One stacked chip 120 may be mounted on each portion corresponding to the individual package substrate 110 included in the package substrate 110S.

Figure 7D:
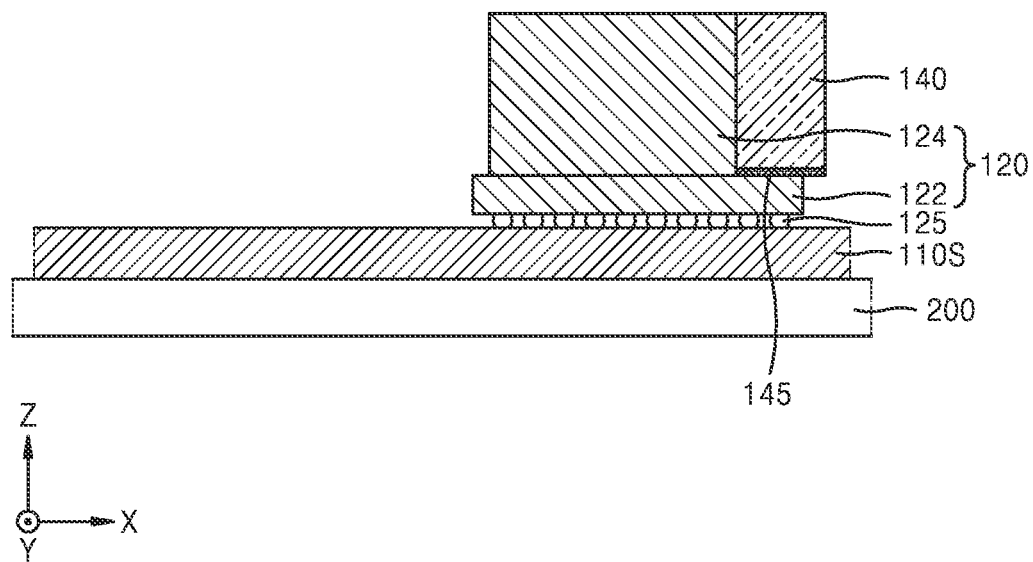

Referring to FIG. 7D, after the upper chip 124 is arranged, the dummy silicon chip 140 may be arranged in contact with the side surface of the upper chip 124 on the lower chip 122. As shown in FIG. 7D, the dummy silicon chip 140 may be arranged in a free space portion of the right portion of the lower chip 122. Alternatively or additionally, the dummy silicon chip 140 may be arranged on the lower chip 122 so that a portion of the dummy silicon chip 140 protrudes in the first direction (e.g., X direction).

In an embodiment, the dummy silicon chip 140 may be bonded and fixed onto the lower chip 122 by using the adhesive layer 145. In an optional or additional embodiment, the adhesive layer 145 may include a material having high thermal conductivity. For example, the adhesive layer 145 may include TIM.

In an embodiment, the dummy silicon chip 140 may have substantially the same length as the upper chip 124 in the second direction (e.g., Y direction). That is, the dummy silicon chip 140 may be manufactured in a manner similar to the semiconductor package 100 of FIG. 1A. In an optional or additional embodiment, the dummy silicon chip 140 may have a length greater than that of the upper chip 124 in the second direction (e.g., Y direction). That is, the dummy silicon chip 140 may be manufactured in a manner similar to the semiconductor package 100a of FIG. 2.

Figure 7E:
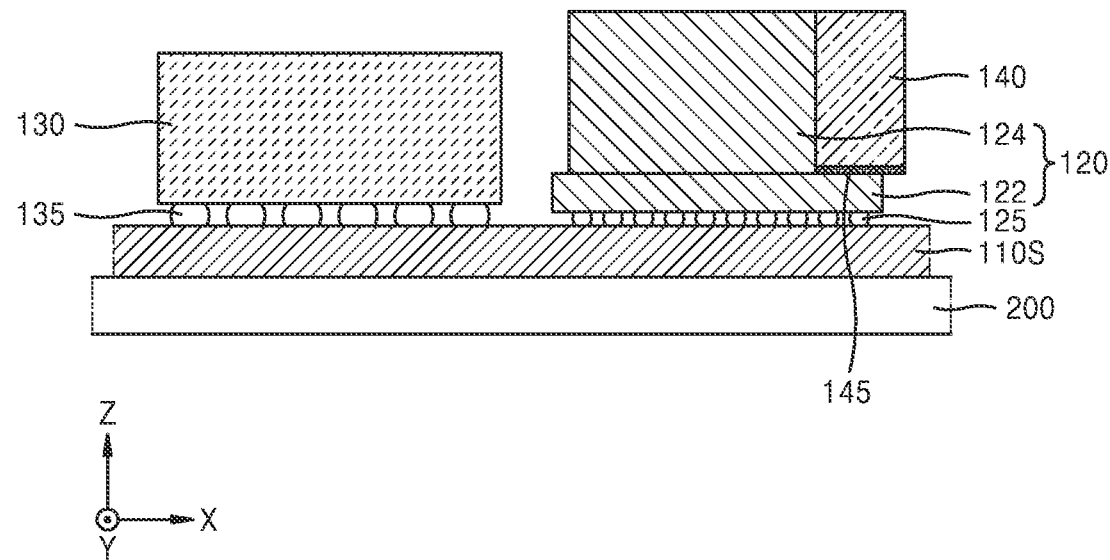

Referring to FIG. 7E, the memory chip 130 may be mounted on the package substrate 110. For example, the memory chip 130 may be mounted on the package substrate 110S by using the second bump 135. As shown in FIG. 7E, the memory chip 130 may be arranged on the left side of the package substrate 110 in the first direction (e.g., X direction). However, when the stacked chip 120 is previously arranged on the left side in the first direction (e.g., X direction), the memory chip 130 may be arranged on the right side of the package substrate 110 in the first direction (e.g., X direction). Although one memory chip 130 is shown in FIG. 7E, one memory chip 130 may be mounted in each portion corresponding to the individual package substrate 110 included in the package substrate 110S.

The memory chip 130 may have an MCP structure or an HBM package structure. However, the memory chip 130 may not be limited to the MCP structure or the HNB package structure. For example, the memory chip 130 may also have a single chip structure. For another example, the memory chip 130 may have an MCP structure including a plurality of DRAM chips.

Figure 7F:
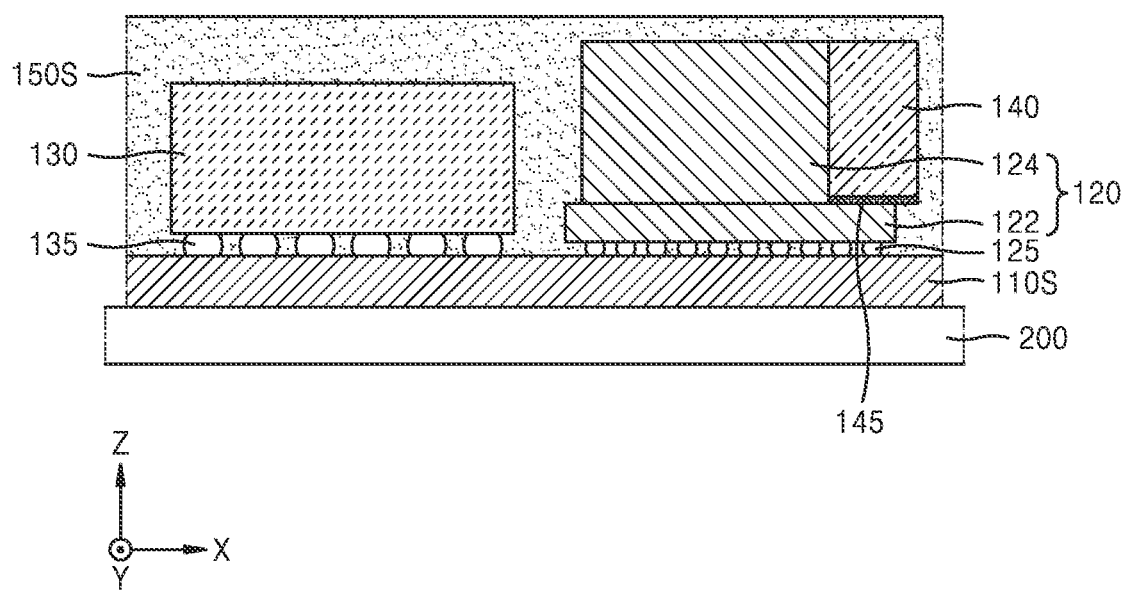

Referring to FIG. 7F, after the memory chip 130 is mounted, an encapsulant 150S covering the stacked chip 120, the dummy silicon chip 140, and the memory chip 130 may be formed on the package substrate 110S. The encapsulant 150S may cover the plurality of stacked chips 120, dummy silicon chips 140, and the plurality of memory chips 130, which may be arranged on the package substrate 110S. The encapsulant 150S may include, for example, EMC. However, the material of the encapsulant 150S is not limited thereto.

Figure 7G:
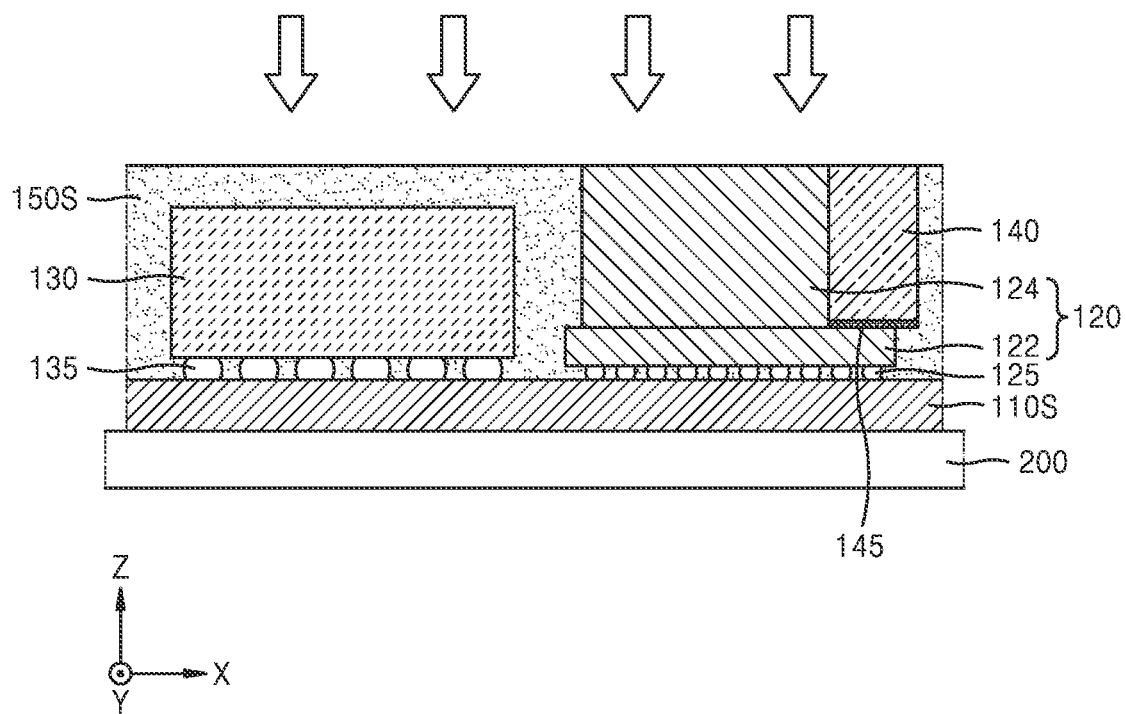

Referring to FIG. 7G, after the encapsulant 150S is formed, as indicated by bold arrows, a planarization process of removing an upper portion of the encapsulant 150S may be performed. The planarization process may also be referred to as a back-grinding process. The planarization process may be performed, for example, by using CMP. By using the planarization process of the encapsulant 150S, the upper surface of the upper chip 124 of the stacked chip 120 and the upper surface of the dummy silicon chip 140 may be exposed from the encapsulant 150S. After the planarization process of the encapsulant 150S, the upper surface of the upper chip 124, the upper surface of the dummy silicon chip 140, and the upper surface of the encapsulant 150S may be substantially coplanar. Alternatively or additionally, as shown in FIG. 7G, a certain thickness of the encapsulant 150S may be maintained on the upper portion of the memory chip 130.

Figure 7H:
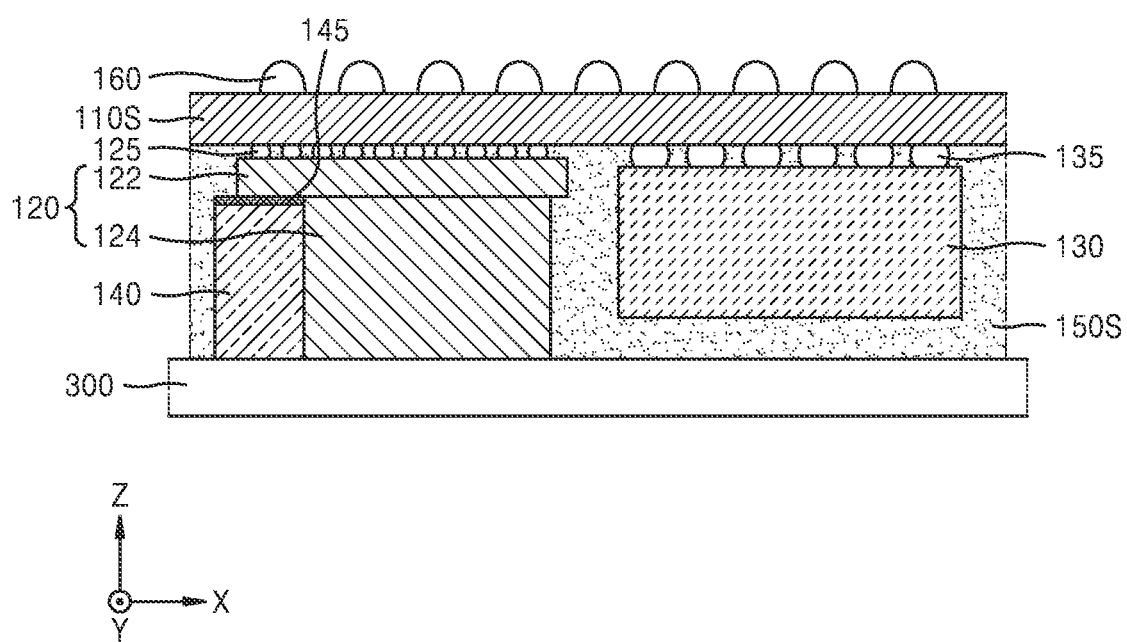

Referring to FIG. 7H, the first carrier substrate 200 may be separated from the package substrate 110S. Alternatively or additionally, the structure on the package substrate 110S and the package substrate 110S may be inverted and attached to a second carrier substrate 300. That is, the encapsulant 150S, and the upper surface of the upper chip 124 and the upper surface of the dummy silicon chip 140, which are exposed from the encapsulant 150S, may be attached and bonded onto the second carrier substrate 300. In such an example, as shown in FIG. 7H, a lower surface of the package substrate 110S may face upward.

Subsequently, the external connection terminal 160 may be formed on the lower surface of the package substrate 110S. The external connection terminal 160 may include a conductive material, such as, but not limited to, at least one of a solder, tin (Sn), silver (Ag), copper (Cu), and aluminum (Al).

Figure 7I:
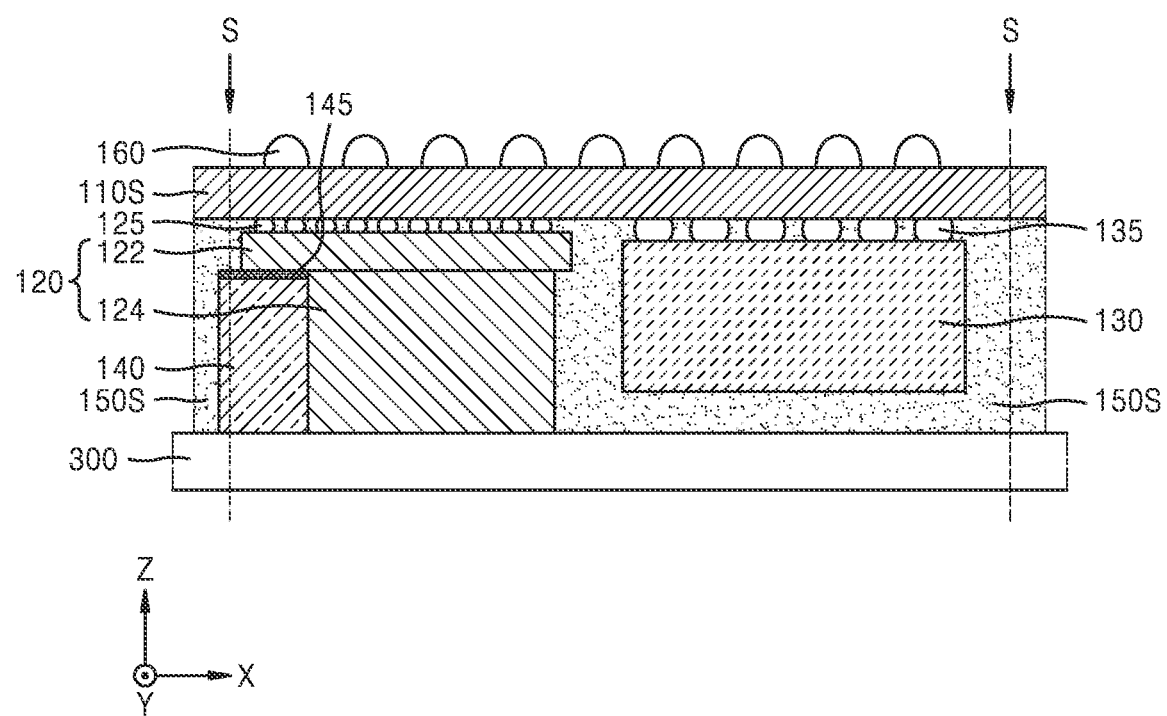

Referring to FIG. 7I, after the external connection terminal 160 is formed, a singulation process may be performed on the package substrate 110S and the structure on the package substrate 110S. As indicated by arrows S, the singulation process may separate the package substrate 110S and the structure on the package substrate 110S into individual semiconductor packages. By using the singulation process, the process of manufacturing the semiconductor package 100 of FIG. 1B and/or the semiconductor package 100a of FIG. 2 may be completed.

Figure 8A:
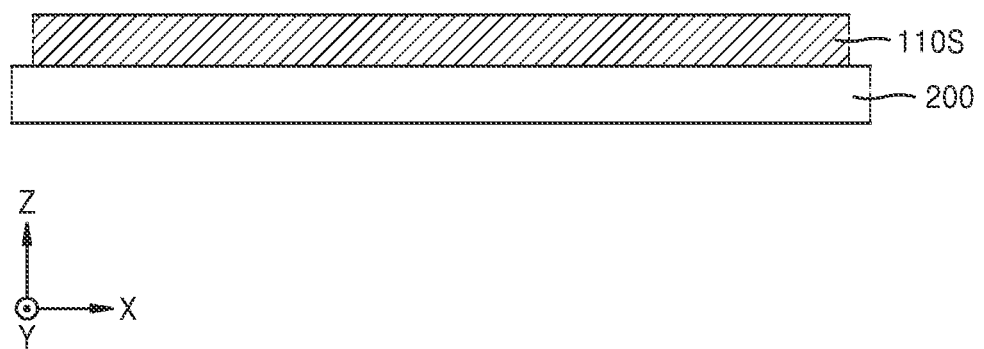
FIGS. 8A and 8B are schematic cross-sectional views of a process of manufacturing the semiconductor package of FIG. 1B or FIG. 2, according to and embodiment.
Figure 8B:
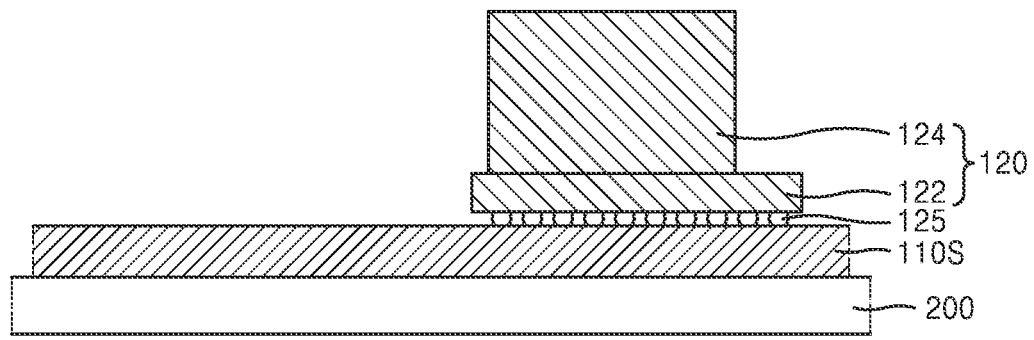

FIGS. 8A and 8B are schematic cross-sectional views of a process of manufacturing at least one of the semiconductor package 100 of FIGS. 1B and 2, according to embodiments. FIGS. 8A and 8B are described with reference to FIG. 1B and FIG. 2. Furthermore, descriptions of features described above with reference to FIGS. 7A through 7I are briefly given or omitted for the sake of brevity.

Referring to FIG. 8A, the package substrate 110S may be formed on the first carrier substrate 200. The method of forming the package substrate 110S is described with reference to FIG. 7A.

Referring to FIG. 8B, after the package substrate 110S is formed, the stacked chip 120 may be mounted on the package substrate 110S. The stacked chip 120 may be mounted on the package substrate 110S by using the first bump 125. As shown in FIG. 8B, the stacked chip 120 may be arranged on the right side of the package substrate 110 in the first direction (e.g., X direction). However, the embodiment is not limited thereto, and the stacked chip 120 may also be arranged on the left side of the package substrate 110 in the first direction (e.g., X direction).

After the stacked chip 120 is formed, the stacked chip 120 may be mounted on the package substrate 110S. That is, the upper chip 124 may be mounted on the lower chip 122 to manufacture the stacked chip 120 first, and then, the stacked chip 120 may be mounted on the package substrate 110S. Alternatively or additionally, the stacked chip 120 may be manufactured by stacking the upper chips 124 on a wafer including a plurality of lower chips and singulating the stacked upper chips 124 and the wafer.

Thereafter, the semiconductor package 100 of FIG. 1B and/or the semiconductor package 100a of FIG. 2 may be manufactured by using processes described above with reference to FIGS. 7D through 7I.

Figure 9A:
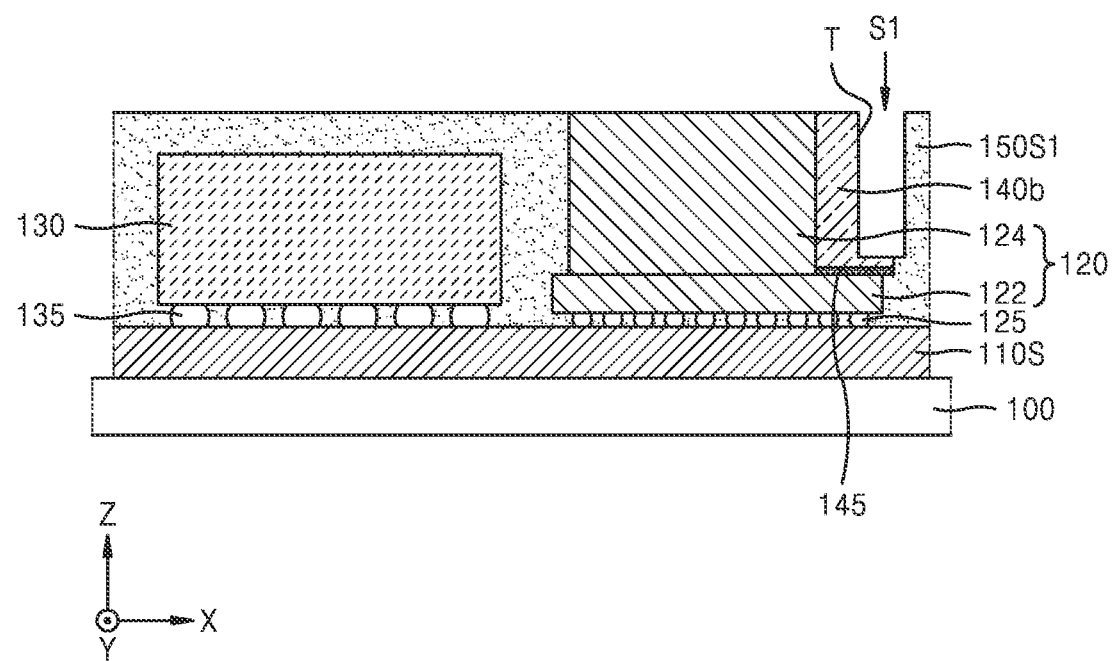
FIGS. 9A through 9C are schematic cross-sectional views of a process of manufacturing the semiconductor package of FIG. 3B or FIG. 4, according to an embodiment.
Figure 9B:
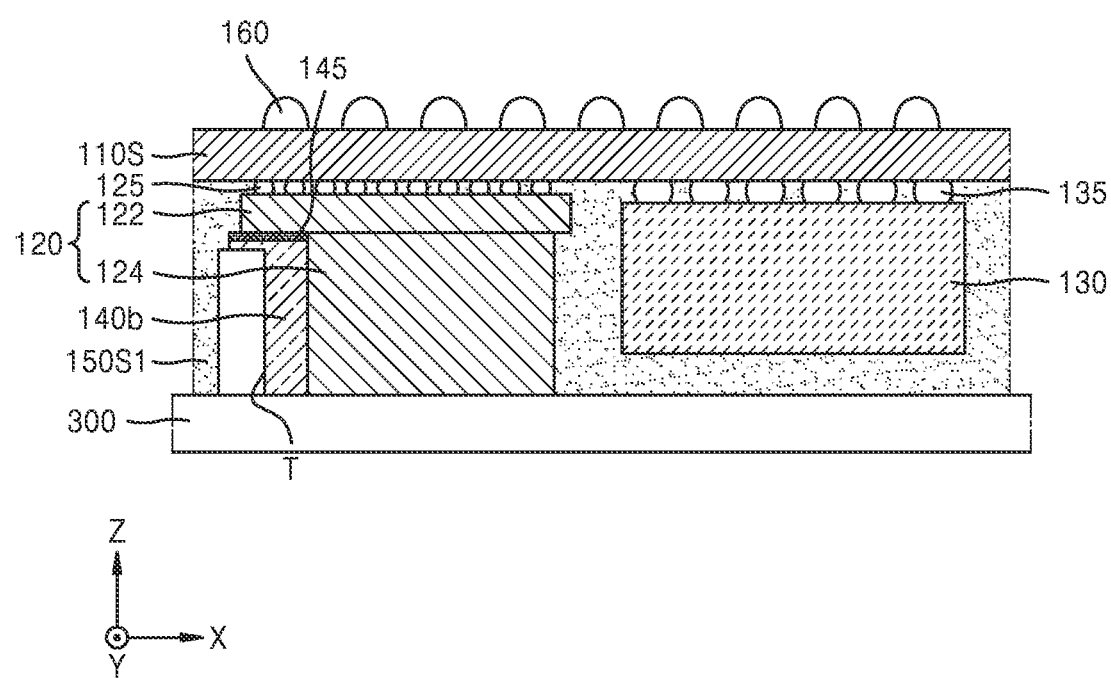
Figure 9C:
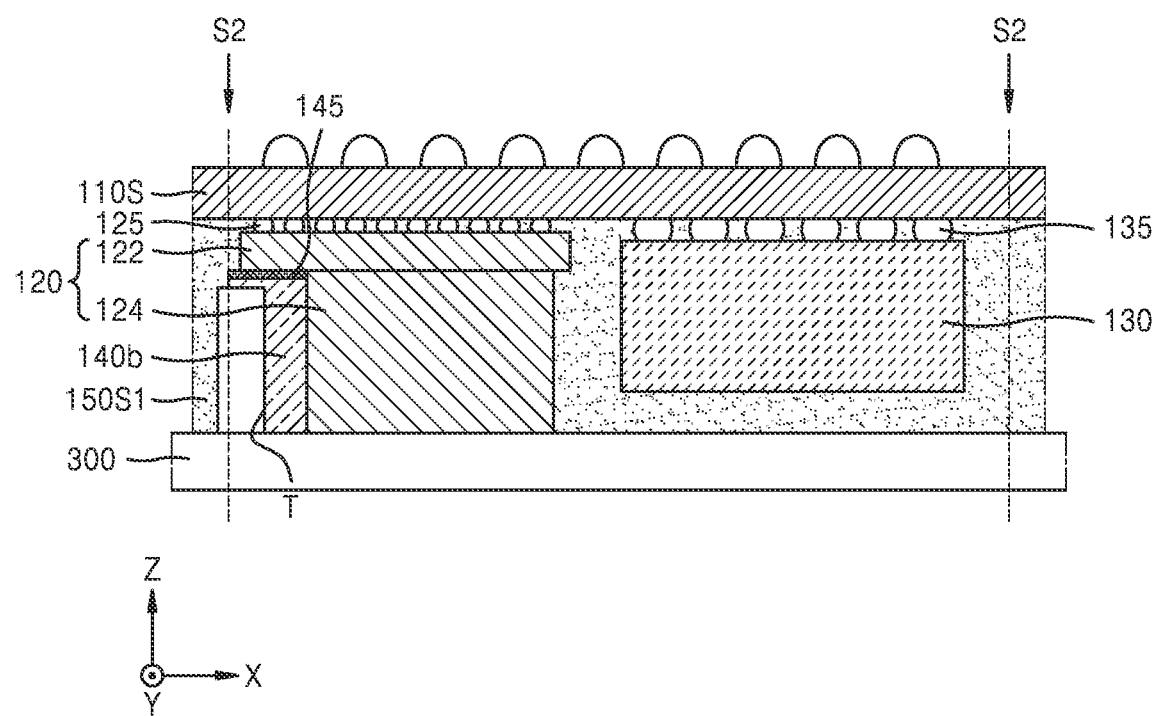

FIGS. 9A through 9C are schematic cross-sectional views of a process of manufacturing at least one of the semiconductor package 100b of FIG. 3B and the semiconductor package 100c of FIG. 4, according to embodiments. FIGS. 9A through 9C are described with reference to FIG. 3B and FIG. 4. Furthermore, descriptions of features described above with reference to FIGS. 7A through 7I are briefly given or omitted for the sake of brevity.

Referring to FIG. 9A, the upper surface of the upper chip 124 and the upper surface of the dummy silicon chip 140 may be exposed by using the processes described above with reference to FIGS. 7A through 7G. Thereafter, by using a first cutting process S1, a trench T having a certain depth may be formed on the dummy silicon chip 140 and the encapsulant 150S. The trench T may extend in the second direction (e.g., Y direction), and may be formed at an interface portion between the dummy silicon chip 140 and the encapsulant 150S. A portion of the remaining dummy silicon chip 140 may be exposed to the bottom surface of the trench T. The side surfaces of the dummy silicon chip 140 may be exposed to the left inner wall of the trench T in the first direction (e.g., X direction). The side surface of the encapsulant 150S may be exposed to the right inner wall. By forming the trench T, a step portion may be formed in an encapsulant 150S1 and the dummy silicon chip 140b. The width of the trench T in the first direction (e.g., X direction) may be substantially the same as the thickness of a blade which has performed the first cutting process S1.

Referring to FIG. 9B, after the trench T is formed, a process of separating the first carrier substrate 200 and attaching the second carrier substrate 300 may be performed, as described above with reference to FIG. 7H. As a result, the lower surface of the package substrate 110S may face upward. Subsequently, the external connection terminal 160 may be formed on the lower surface of the package substrate 110S.

Referring to FIG. 9C, after the external connection terminal 160 is formed, a singulation process may be performed on the package substrate 110S and the structure on the package substrate 110S. As indicated by arrows S2, the singulation process may separate the package substrate 110S and the structure on the package substrate 110S into individual semiconductor packages. As a result of the singulation process, the trench T portion may be exposed, and accordingly, the step portions of the dummy silicon chip 140b and the encapsulant 150S1 may be exposed to the outside. By using the singulation process, the process of manufacturing of at least one of the semiconductor package 100b of FIG. 3B and the semiconductor package 100c of FIG. 4 may be completed. Because the singulation process is a cutting process and is performed after the first cutting process S1, the singulation process may correspond to a second cutting process S2. As a result, a semiconductor package 100b or 100c of the present embodiment may be referred to as being manufactured by using a two-step cutting process.

While the present disclosure has been particularly shown and described with reference to embodiments thereof, it will be understood that various changes in form and details may be made therein without departing from the spirit and scope of the following claims.

What is claimed is:

1. A semiconductor package, comprising:
a package substrate;
a stacked chip disposed on the package substrate and comprising a lower chip and an upper chip;
a memory chip disposed on the package substrate adjacent to the stacked chip; and
an encapsulant encapsulating at least a portion of the stacked chip and the memory chip on the package substrate,
wherein an upper surface of the upper chip is exposed from the encapsulant, and
wherein a dummy silicon chip is in contact with the upper chip on the lower chip.

2. The semiconductor package of claim 1, wherein:
an upper surface of the dummy silicon chip is substantially coplanar with the upper surface of the upper chip, and
the upper surface of the dummy silicon chip is exposed from the encapsulant.

3. The semiconductor package of claim 2, wherein:
side surfaces of the dummy silicon chip are substantially coplanar with side surfaces of the encapsulant and the package substrate, and
the side surfaces of the dummy silicon chip are exposed from the encapsulant.

4. The semiconductor package of claim 2, wherein:
the dummy silicon chip comprises an upper portion and a lower portion,
a first thickness of the upper portion of the dummy silicon chip is smaller than a second thickness of the lower portion of the dummy silicon chip, and
side surfaces of the upper portion of the dummy silicon chip are exposed from the encapsulant.

5. The semiconductor package of claim 4, wherein the encapsulant is disposed on side surfaces of the lower chip and side surfaces of the lower portion of the dummy silicon chip.

6. The semiconductor package of claim 1, wherein:
the dummy silicon chip comprises a metal path, and
an end of the metal path is exposed to the outside of the dummy silicon chip.

7. The semiconductor package of claim 6, further comprising a heat sink coupled to the metal path.

8. The semiconductor package of claim 1, wherein the dummy silicon chip is bonded to the lower chip by using a thermally conductive adhesive layer.

9. The semiconductor package of claim 1, wherein the lower chip is bonded to the upper chip by using a hybrid bonding that is a combination of a pad-to-pad bonding and an insulator-to-insulator bonding.

10. The semiconductor package of claim 1, wherein the memory chip comprises a dynamic random access memory (DRAM) chip.

11. The semiconductor package of claim 1, wherein the memory chip has a high bandwidth memory (HBM) package structure comprising a plurality of dynamic random access memory (DRAM) chips.

12. The semiconductor package of claim 1, wherein the package substrate comprises a redistribution layer (RDL) substrate.

13. A semiconductor package, comprising:
a redistribution substrate;
a stacked chip disposed on the redistribution substrate and comprising a lower chip and an upper chip;
a memory chip disposed on the redistribution substrate adjacent to the stacked chip;
a dummy silicon chip adjacent to the upper chip disposed on the lower chip; and
an encapsulant encapsulating the stacked chip, the memory chip, and the dummy silicon chip on the redistribution substrate,
wherein an upper surface of the upper chip and an upper surface of the dummy silicon chip are exposed from the encapsulant.

14. The semiconductor package of claim 13, wherein:
side surfaces of the dummy silicon chip are substantially coplanar with side surfaces of the redistribution substrate, and
the side surfaces of the dummy silicon chip are exposed from the encapsulant.

15. The semiconductor package of claim 13, wherein:
the dummy silicon chip comprises an upper portion and a lower portion,
a first thickness of the upper portion of the dummy silicon chip is smaller than a second thickness of the lower portion of the dummy silicon chip,
side surfaces of the upper portion of the dummy silicon chip are exposed from the encapsulant, and
the encapsulant is disposed on side surfaces of the lower portion of the dummy silicon chip.

16. The semiconductor package of claim 13, wherein the dummy silicon chip is bonded to the lower chip by using a thermally conductive adhesive layer.

17. The semiconductor package of claim 13, wherein:
the lower chip is bonded to the upper chip by using a hybrid bonding, and
the lower chip is stacked on the redistribution substrate by using a bump.

18. A semiconductor package, comprising:
a redistribution substrate;
a stacked chip disposed on the redistribution substrate and comprising a lower chip and an upper chip;
a dynamic random access memory (DRAM) chip disposed on the redistribution substrate adjacent to the stacked chip;
a dummy silicon chip adjacent to the upper chip disposed on the lower chip;
an encapsulant encapsulating the stacked chip, the DRAM chip, and the dummy silicon chip on the redistribution substrate; and
an external connection terminal disposed under a lower surface of the redistribution substrate,
wherein an upper surface of the upper chip and an upper surface of the dummy silicon chip are exposed from the encapsulant, and
wherein at least a portion of side surfaces of the dummy silicon chip are exposed from the encapsulant.

19. The semiconductor package of claim 18, wherein:
the dummy silicon chip has at least one of a first structure having a substantially similar thickness and a second structure having an upper portion and a lower portion, and
a first thickness of the upper portion is smaller than a second thickness of the lower portion.

20. The semiconductor package of claim 18, wherein:
the lower chip is bonded to the upper chip by using a hybrid bonding, and
the dummy silicon chip is bonded to the lower chip by using a thermally conductive adhesive layer.

* * * * *